US011145689B2

United States Patent
Hall et al.

(10) Patent No.: US 11,145,689 B2
(45) Date of Patent: Oct. 12, 2021

(54) INDICIA FOR LIGHT EMITTING DIODE CHIPS

(71) Applicant: Cree, Inc., Durham, NC (US)

(72) Inventors: Nikolas Hall, Durham, NC (US);
Derek Miller, Holly Springs, NC (US);
Anoop Mathew, Morrisville, NC (US);
Colin Blakely, Franklinton, NC (US);
Luis Breva, Morrisville, NC (US);
Jesse Reiherzer, Raleigh, NC (US);
David Todd Emerson, Chapel Hill, NC (US)

(73) Assignee: CreeLED, Inc., Durham, NC (US)

( * ) Notice: Subject to any disclaimer, the term of this patent is extended or adjusted under 35 U.S.C. 154(b) by 163 days.

(21) Appl. No.: 16/203,709

(22) Filed: Nov. 29, 2018

(65) Prior Publication Data
US 2020/0176507 A1    Jun. 4, 2020

(51) Int. Cl.
*H01L 23/544* (2006.01)
*H01L 27/15* (2006.01)
(Continued)

(52) U.S. Cl.
CPC .......... *H01L 27/156* (2013.01); *H01L 23/544* (2013.01); *H01L 33/005* (2013.01);
(Continued)

(58) Field of Classification Search
CPC ... H01L 27/156; H01L 23/544; H01L 33/005; H01L 33/22; H01L 33/60; H01L 33/62;
(Continued)

(56) References Cited

U.S. PATENT DOCUMENTS

| 5,763,057 A * | 6/1998 | Sawada | H01L 23/544 428/209 |
| 7,029,935 B2 * | 4/2006 | Negley | B29D 11/0074 257/80 |

(Continued)

OTHER PUBLICATIONS

Definition of "indicia" the plural form of "indicium", Oxford English Dictionary, https://www.oed.com/view/Entry/94429?, date accessed Sep. 25, 2020 (Year: 2020).*

*Primary Examiner* — Earl N Taylor
(74) *Attorney, Agent, or Firm* — Withrow & Terranova, PLLC

(57) ABSTRACT

Solid-state lighting devices including light-emitting diodes (LEDs) and more particularly LED chips and related methods are disclosed. LED chips are provided that include an indicia arranged between a primary light-emitting face and a mounting face of the LED chip. The indicia may include at least one of a logo, one or more alphanumeric characters, or a symbol, among others that are configured to convey information. Arrangements of at least one of an n-contact, a p-contact, or a reflector layer of the LED chip may form the indicia. LED chips are also provided where at least a portion of an indicia is arranged on a mounting face of the LED chip. Indicia are provided that may be visible through primary light-emitting faces when LED chips are electrically activated or electrically deactivated. In this regard, the indicia may be embedded within LED chips while still being able to convey information.

18 Claims, 13 Drawing Sheets

(51) Int. Cl.
*H01L 33/22* (2010.01)
*H01L 33/60* (2010.01)
*H01L 33/62* (2010.01)
*H01L 33/00* (2010.01)

(52) U.S. Cl.
CPC .............. *H01L 33/22* (2013.01); *H01L 33/60* (2013.01); *H01L 33/62* (2013.01); *H01L 2223/5442* (2013.01); *H01L 2223/54406* (2013.01); *H01L 2223/54426* (2013.01); *H01L 2223/54433* (2013.01); *H01L 2933/0066* (2013.01)

(58) Field of Classification Search
CPC ..... H01L 2223/544; H01L 2223/54406; H01L 2223/5442; H01L 2223/54433
See application file for complete search history.

(56) References Cited

U.S. PATENT DOCUMENTS

| | | | | |
|---|---|---|---|---|
| 7,906,793 B2* | 3/2011 | Negley | ................ | H01L 33/486 |
| | | | | 257/98 |
| 8,415,260 B2* | 4/2013 | Banach | ................ | H01L 23/544 |
| | | | | 438/800 |
| 8,866,169 B2* | 10/2014 | Emerson | ................ | H01L 33/58 |
| | | | | 257/98 |
| 8,911,105 B2* | 12/2014 | Edmond | ................ | F21K 9/232 |
| | | | | 362/235 |
| 9,070,850 B2* | 6/2015 | Keller | ................ | H01L 33/486 |
| 9,123,864 B2* | 9/2015 | Tomonari | ................ | H01L 33/38 |
| 9,166,107 B2* | 10/2015 | Park | ................ | H01L 33/12 |
| 9,166,111 B2* | 10/2015 | Matsui | ................ | H01L 33/42 |
| 9,219,200 B2* | 12/2015 | Erchak | ................ | H01L 33/30 |
| 9,281,445 B2* | 3/2016 | Donofrio | ................ | H01L 33/32 |
| 9,318,529 B2* | 4/2016 | Jang | ................ | H01L 33/62 |
| 9,362,455 B2* | 6/2016 | Edmond | ................ | H01L 33/38 |
| 9,373,756 B2* | 6/2016 | Lee | ................ | H01L 25/0753 |
| 9,412,907 B1* | 8/2016 | Place | ................ | H01L 33/08 |
| 9,470,373 B2* | 10/2016 | Hiller | ................ | G09F 13/06 |
| 9,887,327 B2* | 2/2018 | Reiherzer | ................ | H01L 33/505 |
| 10,734,363 B2* | 8/2020 | Andrews | ................ | H01L 23/60 |
| 2005/0184300 A1* | 8/2005 | Tazima | ................ | H01L 33/405 |
| | | | | 257/94 |
| 2012/0031977 A1* | 2/2012 | Havens | ................ | H01L 27/14618 |
| | | | | 235/472.01 |
| 2012/0074438 A1* | 3/2012 | Hwang | ................ | H01L 33/38 |
| | | | | 257/88 |
| 2012/0235142 A1* | 9/2012 | Song | ................ | H01L 25/167 |
| | | | | 257/48 |
| 2013/0277696 A1* | 10/2013 | Matsui | ................ | H01L 33/405 |
| | | | | 257/96 |
| 2015/0179903 A1* | 6/2015 | Pun | ................ | H01L 25/0753 |
| | | | | 257/88 |
| 2015/0228876 A1* | 8/2015 | Place | ................ | H01L 33/08 |
| | | | | 257/93 |
| 2016/0178158 A1* | 6/2016 | Power | ................ | B29C 45/14016 |
| | | | | 362/363 |
| 2017/0098746 A1* | 4/2017 | Bergmann | ................ | H01L 33/60 |
| 2017/0294418 A1* | 10/2017 | Edmond | ................ | H01L 25/50 |
| 2018/0145058 A1* | 5/2018 | Meitl | ................ | H01L 33/0095 |
| 2018/0175247 A1* | 6/2018 | Yoon | ................ | H01L 33/405 |
| 2018/0212108 A1* | 7/2018 | Leirer | ................ | H01L 33/36 |
| 2019/0074266 A1* | 3/2019 | Andrews | ................ | H01L 23/60 |
| 2019/0165226 A1* | 5/2019 | Kim | ................ | H01L 33/12 |
| 2019/0326485 A1* | 10/2019 | Damborsky | ................ | H01L 33/26 |
| 2020/0166802 A1* | 5/2020 | Fukushima | ................ | F21S 2/00 |
| 2020/0176507 A1* | 6/2020 | Hall | ................ | H01L 33/62 |

* cited by examiner

INDICIA FOR LIGHT EMITTING DIODE CHIPS

FIELD OF THE DISCLOSURE

The present disclosure relates to solid-state lighting devices including light-emitting diodes (LEDs) and more particularly to LED chips and related methods.

BACKGROUND

Solid-state lighting devices such as light-emitting diodes (LEDs) are increasingly used in both consumer and commercial applications. Advancements in LED technology have resulted in highly efficient and mechanically robust light sources with a long service life. Accordingly, modern LEDs have enabled a variety of new display applications and are being increasingly utilized for general illumination applications, often replacing incandescent and fluorescent light sources.

LEDs are solid-state devices that convert electrical energy to light and generally include one or more active layers of semiconductor material (or an active region) arranged between oppositely doped n-type and p-type layers. When a bias is applied across the doped layers, holes and electrons are injected into the one or more active layers where they recombine to generate emissions such as visible light or ultraviolet emissions. An active region may be fabricated, for example, from silicon carbide, gallium nitride, gallium phosphide, aluminum nitride, and/or gallium arsenide-based materials and/or from organic semiconductor materials. Photons generated by the active region are initiated in all directions.

Typically, it is desirable to operate LEDs at the highest light emission efficiency, which can be measured by the emission intensity in relation to the output power (e.g., in lumens per watt). A practical goal to enhance emission efficiency is to maximize extraction of light emitted by the active region in the direction of the desired transmission of light. Light extraction and external quantum efficiency of an LED can be limited by a number of factors, including internal reflection. According to the well-understood implications of Snell's law, photons reaching the surface (interface) between an LED surface and the surrounding environment will be either refracted or internally reflected. If photons are internally reflected in a repeated manner, then such photons will eventually be absorbed and never provide visible light that exits an LED.

To increase the opportunity for photons to exit an LED, it has been found useful to pattern, roughen, or otherwise texture the interface between an LED surface and the surrounding environment to provide a varying surface that increases the probability of refraction over internal reflection and thus enhances light extraction. Another way to increase light extraction efficiency is to provide reflective surfaces that reflect generated light so that such light may contribute to useful emission from an LED chip. LEDs have been developed with internal reflective surfaces or layers to reflect generated light.

As advancements in modern LED technology progress, the art continues to seek improved LEDs and solid-state lighting devices having desirable illumination characteristics capable of overcoming challenges associated with conventional lighting devices.

SUMMARY

The present disclosure relates to solid-state lighting devices including light-emitting diodes (LEDs) and more particularly to LED chips and related methods. An LED chip may be provided that includes an indicia arranged between a primary light-emitting face and a mounting face of the LED chip. The indicia may include at least one of a logo, one or more alphanumeric characters, or a symbol configured to convey information. In certain embodiments, arrangements of at least one of an n-contact, a p-contact, or a reflector layer of the LED chip form the indicia. In certain embodiments, an LED chip may be provided where at least a portion of an indicia is arranged on a mounting face of the LED chip. According to embodiments disclosed herein, indicia are provided that may be visible through primary light-emitting faces when LED chips are electrically activated or electrically deactivated. In this regard, the indicia may be embedded within LED chips while still being able to convey information.

In one aspect, an LED chip comprises a mounting face configured to be mounted to a surface; a primary light-emitting face that is opposite the mounting face; an active LED structure arranged between the mounting face and the primary light-emitting face, wherein the active LED structure comprises an n-type layer, a p-type layer, and an active layer arranged between the n-type layer and the p-type layer; and an indicia arranged between the mounting face and the primary light-emitting face. The indicia may comprise at least one of a logo, one or more alphanumeric characters, a symbol, an alignment marker, a fiducial marker, or a polarity marker configured to convey information. In certain embodiments, the indicia is arranged closer to the mounting face than the primary light-emitting face. The LED chip may further comprise an n-contact electrically connected to the n-type layer, wherein a portion of the n-contact forms the indicia. The n-contact may comprise one or more n-contact interconnects that extend through a portion of the active LED structure to the n-type layer. In certain embodiments, the one or more n-contact interconnects form the indicia. In certain embodiments, the one or more n-contact interconnects form an outline of the indicia and a portion of the active LED structure that is bounded by the outline comprises a portion of the n-type layer, the p-type layer, and the active layer. The portion of the active LED structure that is bounded by the outline may be continuous with other portions of the active LED structure that are not bounded by the outline.

In certain embodiments, the LED chip may further comprise a reflective structure on the p-type layer, wherein a portion of the reflective structure forms the indicia. The reflective structure may comprise a metal layer, a dielectric layer, and one or more reflective layer interconnects that extend through a portion of the dielectric layer. In certain embodiments, the one or more reflective layer interconnects form the indicia. In certain embodiments, a pattern of the reflective structure forms the indicia.

In certain embodiments, the LED chip may further comprise an n-contact electrically connected to the n-type layer, wherein a portion of the n-contact forms the indicia; and a reflector layer on the p-type layer wherein a portion of the reflector layer forms another indicia. In certain embodiments, the LED chip further comprises a growth substrate, wherein a portion of the growth substrate forms the primary light-emitting face.

In another aspect, an LED chip comprises a mounting face configured to be mounted to a surface; a primary light-emitting face that is opposite the mounting face; an active LED structure arranged between the mounting face and the primary light-emitting face, wherein the active LED structure comprises an n-type layer, a p-type layer, and an active layer arranged between the n-type layer and the p-type layer; and at least a portion of an indicia arranged on the mounting face. The LED chip may further comprise a p-contact electrically connected to the p-type layer, wherein the p-contact comprises a portion that is on the mounting face and a p-contact interconnect that extends through a passivation layer. In certain embodiments, the p-contact forms the indicia. In certain embodiments, the p-contact interconnect forms at least a portion of the indicia. In certain embodiments, the portion of the p-contact that is on the mounting face forms another portion of the indicia. The indicia may comprise at least one of a logo, one or more alphanumeric characters, a symbol configured to convey information, an alignment marker, a fiducial marker, or a polarity marker.

In another aspect, a method comprises forming an LED chip that comprises a mounting face configured to be mounted to a surface, a primary light-emitting face that is opposite the mounting face, and an indicia; and mounting the LED chip to a mounting surface such that the indicia is arranged between the primary light-emitting face and the mounting surface. The method may further comprise electrically activating the LED chip to form a projection of the indicia. In certain embodiments, the indicia is visible when the LED chip is electrically deactivated. In certain embodiments, the indicia comprises at least one of a logo, one or more alphanumeric characters, a symbol, an alignment marker, a fiducial marker, or a polarity marker configured to convey information.

In another aspect, any of the foregoing aspects, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
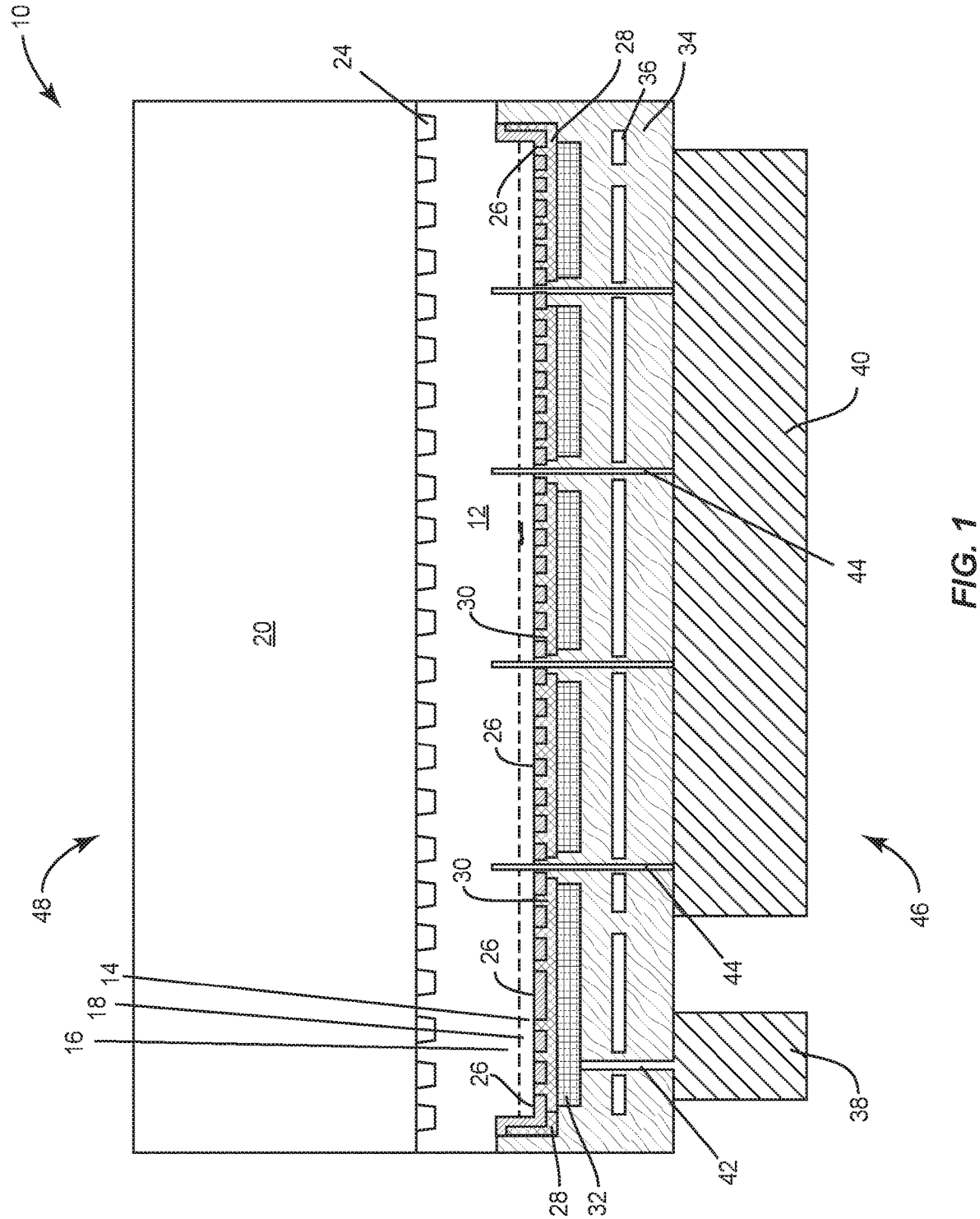
FIG. 1 is a cross-sectional view of a representative LED chip arranged in a flip-chip configuration.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments of the disclosure are described herein with reference to cross-sectional view and top-view illustrations that are schematic illustrations of embodiments of the disclosure. As such, the actual dimensions of elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure.

The present disclosure relates to solid-state lighting devices including light-emitting diodes (LEDs) and more particularly to LED chips and related methods. An LED chip may be provided that includes an indicia arranged between a primary light-emitting face and a mounting face of the LED chip. The indicia may include at least one of a logo, one or more alphanumeric characters, or a symbol configured to convey information. In certain embodiments, arrangements of at least one of an n-contact, a p-contact, or a reflector layer of the LED chip form the indicia. In certain embodiments, an LED chip may be provided where at least a portion of an indicia is arranged on a mounting face of the LED chip. According to embodiments disclosed herein, indicia are provided that may be visible through primary light-emitting faces when LED chips are electrically activated or electrically deactivated. In this regard, the indicia may be embedded within LED chips while still being able to convey information.

As described herein, LED chips can include complex arrangements of elements including active LED structures, reflective layers, dielectric layers, and various contact structures, among others. Depending on the size of a particular LED chip, the arrangement of certain elements may be visible with the aid of a microscope or another magnifying optic and either barely visible or not visible without the aid of magnification. Counterfeit or copycat LED chips, which are typically of lower quality, are becoming more prominent in the marketplace and include arrangements of elements intended to look the same as an LED chip from a reputable manufacturer. Once LED chips are incorporated into lighting devices, it can be difficult to distinguish which lighting devices include such counterfeit or copycat LED chips. This can be especially problematic when lower quality or failed LED chips are mistakenly returned to a reputable manufacturer under the belief that they originated from that manufacturer. According to embodiments disclosed herein, LED chips include arrangements of elements that form one or more indicia. As used herein, the term "indicia" or "indicator indicia" may be used interchangeably with the term "indicium" and may include one or more various types of indicators or identifying marks. The indicia may include at least one of a logo, one or more alphanumeric characters, or a symbol configured to convey information. The indicia may include a company's name, or a designation of origin or source, or a trademark. The indicia may include information about the LED chip, including wavelength of light, brightness, or other performance characteristic. In some embodiments, the indicia may include other novelty symbols, such as a happy face or a peace sign. Some indicia may be formed to be visible with the aid of a microscope while other indicia may be formed to be visible without a microscope. In this regard, the indicia may make it easier to distinguish counterfeit or copycat LED chips as well as provide additional deterrents or difficulties for direct copying.

An LED chip typically comprises an active LED structure or region that can have many different semiconductor layers arranged in different ways. The fabrication and operation of LEDs and their active structures are generally known in the art and are only briefly discussed herein. The layers of the active LED structure can be fabricated using known processes with a suitable process being fabrication using metal organic chemical vapor deposition. The layers of the active LED structure can comprise many different layers and generally comprise an active layer sandwiched between n-type and p-type oppositely doped epitaxial layers, all of which are formed successively on a growth substrate. It is understood that additional layers and elements can also be included in the active LED structure, including, but not limited to, buffer layers, nucleation layers, super lattice structures, un-doped layers, cladding layers, contact layers, and current-spreading layers and light extraction layers and elements. The active layer can comprise a single quantum well, a multiple quantum well, a double heterostructure, or super lattice structures.

The active LED structure can be fabricated from different material systems, with some material systems being Group III nitride-based material systems. Group III nitrides refer to those semiconductor compounds formed between nitrogen (N) and the elements in Group III of the periodic table, usually aluminum (Al), gallium (Ga), and indium (In). Gallium nitride (GaN) is a common binary compound.

Group III nitrides also refer to ternary and quaternary compounds such as aluminum gallium nitride (AlGaN), indium gallium nitride (InGaN), and aluminum indium gallium nitride (AlInGaN). For Group III nitrides, silicon (Si) is a common n-type dopant and magnesium (Mg) is a common p-type dopant. Accordingly, the active layer, n-type layer, and p-type layer may include one or more layers of GaN, AlGaN, InGaN, and AlInGaN that are either undoped or doped with Si or Mg for a material system based on Group III nitrides. Other material systems include silicon carbide (SiC), organic semiconductor materials, and other Group III-V systems such as gallium phosphide (GaP), gallium arsenide (GaAs), and related compounds.

The active LED structure may be grown on a growth substrate that can include many materials, such as sapphire, SiC, aluminum nitride (AlN), GaN, with a suitable substrate being a 4H polytype of SiC, although other SiC polytypes can also be used including 3C, 6H, and 15R polytypes. SiC has certain advantages, such as a closer crystal lattice match to Group III nitrides than other substrates and results in Group III nitride films of high quality. SiC also has a very high thermal conductivity so that the total output power of Group III nitride devices on SiC is not limited by the thermal dissipation of the substrate. Sapphire is another common substrate for Group III nitrides and also has certain advantages, including being lower cost, having established manufacturing processes, and having good light transmissive optical properties.

Different embodiments of the active LED structure can emit different wavelengths of light depending on the composition of the active layer and n-type and p-type layers. In some embodiments, the active LED structure emits blue light with a peak wavelength range of approximately 430 nanometers (nm) to 480 nm. In other embodiments, the active LED structure emits green light with a peak wavelength range of 500 nm to 570 nm. In other embodiments, the active LED structure emits red light with a peak wavelength range of 600 nm to 650 nm.

The LED chip can also be covered with one or more lumiphoric or other conversion materials, such as phosphors, such that at least some of the light from the LED chip is absorbed by the one or more phosphors and is converted to one or more different wavelength spectra according to the characteristic emission from the one or more phosphors. In some embodiments, the combination of the LED chip and the one or more phosphors emits a generally white combination of light. The one or more phosphors may include yellow (e.g., YAG:Ce), green (e.g., LuAg:Ce), and red (e.g., $Ca_{i-x-y}Sr_xEu_yAlSiN_3$) emitting phosphors, and combinations thereof. Lumiphoric materials as described herein may be or include one or more of a phosphor, a scintillator, a lumiphoric ink, a quantum dot material, a day glow tape, and the like. Lumiphoric materials may be provided by any suitable means, for example, direct coating on one or more surfaces of an LED, dispersal in an encapsulant material configured to cover one or more LEDs, and/or coating on one or more optical or support elements (e.g., by powder coating, inkjet printing, or the like). In certain embodiments, lumiphoric materials may be downconverting or upconverting, and combinations of both downconverting and upconverting materials may be provided. In certain embodiments, multiple different (e.g., compositionally different) lumiphoric materials arranged to produce different peak wavelengths may be arranged to receive emissions from one or more LED chips. In some embodiments, one or more phosphors may include yellow phosphor (e.g., YAG:Ce), green phosphor (e.g., LuAg:Ce), and red phosphor (e.g., $Ca_{i-x-y}Sr_xEu_y$-$AlSiN_3$) and combinations thereof. One or more lumiphoric materials may be provided on one or more portions of an LED chip and/or a submount in various configurations. In certain embodiments, one or more surfaces of LED chips may be conformally coated with one or more lumiphoric materials, while other surfaces of such LED chips and/or associated submounts may be devoid of lumiphoric material. In certain embodiments, a top surface of an LED chip may include lumiphoric material, while one or more side surfaces of an LED chip may be devoid of lumiphoric material. In certain embodiments, all or substantially all outer surfaces of an LED chip (e.g., other than contact-defining or mounting surfaces) are coated or otherwise covered with one or more lumiphoric materials. In certain embodiments, one or more lumiphoric materials may be arranged on or over one or more surfaces of an LED chip in a substantially uniform manner. In other embodiments, one or more lumiphoric materials may be arranged on or over one or more surfaces of an LED chip in a manner that is non-uniform with respect to one or more of material composition, concentration, and thickness. In certain embodiments, the loading percentage of one or more lumiphoric materials may be varied on or among one or more outer surfaces of an LED chip. In certain embodiments, one or more lumiphoric materials may be patterned on portions of one or more surfaces of an LED chip to include one or more stripes, dots, curves, or polygonal shapes. In certain embodiments, multiple lumiphoric materials may be arranged in different discrete regions or discrete layers on or over an LED chip.

Light emitted by the active layer or region of an LED chip typically has a lambertian emission pattern. For directional applications, internal mirrors or external reflective surfaces may be employed to redirect as much light as possible toward a desired emission direction. Internal mirrors may include single or multiple layers. Some multi-layer mirrors include a metal reflector layer and a dielectric reflector layer, wherein the dielectric reflector layer is arranged between the metal reflector layer and a plurality of semiconductor layers. A passivation layer is arranged between the metal reflector layer and first and second electrical contacts, wherein the first electrical contact is arranged in conductive electrical communication with a first semiconductor layer, and the second electrical contact is arranged in conductive electrical communication with a second semiconductor layer. For single or multi-layer mirrors including surfaces exhibiting less than 100% reflectivity, some light may be absorbed by the mirror. Additionally, light that is redirected through the active LED structure may be absorbed by other layers or elements within the LED chip.

As used herein, a layer or region of a light-emitting device may be considered to be "transparent" when at least 80% of emitted radiation that impinges on the layer or region emerges through the layer or region. Moreover, as used herein, a layer or region of an LED is considered to be "reflective" or embody a "mirror" or a "reflector" when at least 80% of the emitted radiation that impinges on the layer or region is reflected. In some embodiments, the emitted radiation comprises visible light such as blue and/or green LEDs with or without lumiphoric materials. In other embodiments, the emitted radiation may comprise nonvisible light. For example, in the context of GaN-based blue and/or green LEDs, silver (Ag) may be considered a reflective material (e.g., at least 80% reflective). In the case of ultraviolet (UV) LEDs, appropriate materials may be selected to provide a desired, and in some embodiments high, reflectivity and/or a desired, and in some embodiments low, absorption. In certain embodiments, a "light-transmissive" material may be configured to transmit at least 50% of emitted radiation of a desired wavelength.

The present disclosure can be useful for LED chips having a variety of geometries, such as vertical geometry or lateral geometry. A vertical geometry LED chip typically includes anode and cathode connections on opposing sides or faces of the LED chip. A lateral geometry LED chip typically includes both anode and cathode connections on the same side of the LED chip that is opposite a substrate, such as a growth substrate. In some embodiments, a lateral geometry LED chip may be mounted on a submount of an LED package such that the anode and cathode connections are on a face of the LED chip that is opposite the submount. In this configuration, wirebonds may be used to provide electrical connections with the anode and cathode connections. In other embodiments, a lateral geometry LED chip may be flip-chip mounted on a surface of a submount of an LED package such that the anode and cathode connections are on a face of the active LED structure that is adjacent to the submount. In this configuration, electrical traces or patterns may be provided on the submount for providing electrical connections to the anode and cathode connections of the LED chip. In a flip-chip configuration, the active LED structure is configured between the substrate of the LED chip and the submount for the LED package. Accordingly, light emitted from the active LED structure may pass through the substrate in a desired emission direction. In some embodiments, the flip-chip LED chip may be configured as described in commonly-assigned U.S. Publication No. 2017/0098746, which is hereby incorporated by reference herein. In some embodiments, an LED package may be configured as set forth in the following commonly-assigned U.S. patents and U.S. publications, which are hereby incorporated by reference herein: U.S. Pat. Nos. 8,866,169; 9,070,850; 9,887,327; and U.S. Publication No. 2015/0179903.

FIG. 1 is a cross-sectional view of a representative LED chip 10 arranged in a flip-chip configuration, although other configurations are possible. The LED chip 10 includes an active structure 12 comprising a p-type layer 14, an n-type layer 16, and an active layer 18 formed on a substrate 20. In some embodiments, the n-type layer 16 is between the active layer 18 and the substrate 20. In other embodiments, the doping order may be reversed such that a layer 16 is doped p-type and a layer 14 is doped n-type. The substrate 20 can comprise many different materials such as SiC or sapphire and can have one or more surfaces that are shaped, textured, or patterned to enhance light extraction. In certain embodiments, the substrate 20 is light transmissive (preferably transparent) and includes a patterned surface 24 that is proximate the active LED structure 12 and includes multiple recessed and/or raised features. In some embodiments, the patterned surface 24 is adjacent the n-type layer 16 of the active LED structure 12. The patterned surface 24 is particularly useful in embodiments in which the substrate 20 comprises sapphire in order to promote extraction of light through an interface between the active LED structure 12 and the substrate 20.

In FIG. 1, a first reflective layer 26 is provided on the p-type layer 14. In certain embodiments, a current spreading layer (not shown) may be provided between the p-type layer 14 and the first reflective layer 26. The current spreading layer may include a thin layer of a transparent conductive oxide such as indium tin oxide (ITO) or a metal such as platinum (Pt), although other materials may be used. The first reflective layer 26 can comprise many different materials and preferably comprises a material that presents an index of refraction step with the material comprising the active LED structure 12 to promote total internal reflection (TIR) of light generated from the active LED structure 12. Light that experiences TIR is redirected without experiencing absorption or loss, and can thereby contribute to useful or desired LED chip emission. In some embodiments, the first reflective layer 26 comprises a material with an index of refraction lower than the index of refraction of the active LED structure 12 material. The first reflective layer 26 may comprise many different materials, with some having an index of refraction less than 2.3, while others can have an index of refraction less than 2.15, less than 2.0, and less than 1.5. In some embodiments the first reflective layer 26 comprises a dielectric material, with some embodiments comprising silicon dioxide ($SiO_2$) and/or silicon nitride (SiN). It is understood that many dielectric materials can be used such as SiN, SiNx, $Si_3N_4$, Si, germanium (Ge), $SiO_2$, SiOx, titanium dioxide ($TiO_2$), tantalum pentoxide ($Ta_2O_5$), ITO, MgOx, zinc oxide (ZnO), and combinations thereof. In certain embodiments, the first reflective layer 26 may include multiple alternating layers of different dielectric materials, e.g. alternating layers of $SiO_2$ and SiN. Some Group III nitride materials such as GaN can have an index of refraction of approximately 2.4, and $SiO_2$ can have an index of refraction of approximately 1.48, and SiN can have an index of refraction of approximately 1.9. Embodiments with an active LED structure 12 comprising GaN and the first reflective layer 26 that comprises $SiO_2$ can have a sufficient index of refraction step between the two to allow for efficient TIR of light. The first reflective layer 26 can have different thicknesses depending on the type of materials used, with some embodiments having a thickness of at least 0.2 microns (μm). In some of these embodiments, it can have a thickness in the range of 0.2 μm to 0.7 μm, while in some of these embodiments it can be approximately 0.5 μm thick.

In FIG. 1, the LED chip 10 may further include a second reflective layer 28 that is on the first reflective layer 26 such that the first reflective layer 26 is arranged between the active LED structure 12 and the second reflective layer 28. The second reflective layer 28 may include a metal layer that is configured to reflect any light from the active LED structure 12 that may pass through the first reflective layer 26. The second reflective layer 28 can comprise many different materials such as Ag, gold (Au), Al, or combinations thereof. As illustrated, the second reflective layer 28 may include one or more reflective layer interconnects 30 that provide an electrically conductive path through the first reflective layer 26. In certain embodiments, the reflective layer interconnects 30 comprise reflective layer vias. Accordingly, the first reflective layer 26, the second reflective layer 28, and the reflective layer interconnects 30 form a reflective structure of the LED chip 10. In some embodiments, the reflective layer interconnects 30 comprise the same material as the second reflective layer 28 and are formed at the same time as the second reflective layer 28. In other embodiments, the reflective layer interconnects 30 may comprise a different material than the second reflective layer 28. The LED chip 10 may also comprise a barrier layer 32 on the second reflective layer 28 to prevent migration of the second reflective layer 28 material, such as Ag, to other layers. Preventing this migration helps the LED chip 10 maintain efficient operation through its lifetime. The barrier layer 32 may comprise an electrically conductive material, with suitable materials including but not limited to sputtered Ti/Pt followed by evaporated Au bulk material or sputtered Ti/Ni followed by an evaporated Ti/Au bulk material. A passivation layer 34 is included on the barrier layer 32 as well as any portions of the second reflective layer 28 that may be uncovered by the barrier layer 32. The passivation layer 34 protects and provides electrical insulation for the LED chip 10 and can comprise many different materials, such as a dielectric material. In some embodiments, the passivation 34 is a single layer, and in other embodiments, the passivation layer 32 comprises a plurality of layers. A suitable material for the passivation layer 34 includes but is not limited to silicon nitride. In some embodiments, the passivation layer 34 includes a metal-containing interlayer 36 arranged therein, wherein the interlayer 36 may comprise Al or another suitable metal. Notably, the interlayer 36 is embedded within the passivation layer 34 and is electrically isolated from the rest of the LED chip 10. In application, the interlayer 36 may function as a crack stop layer for any cracks that may propagate through the passivation layer 34. Additionally, the interlayer 36 may reflect at least some light that may pass through both the first reflective layer 26 and the second reflective layer 28.

In FIG. 1, the LED chip 10 comprises a p-contact 38 and an n-contact 40 that are arranged on the passivation layer 34 and are configured to provide electrical connections with the active LED structure 12. The p-contact 38, which may also be referred to as an anode contact, may comprise one or more p-contact interconnects 42 that extend through the passivation layer 34 to the barrier layer 32 or the second reflective layer 28 to provide an electrical path to the p-type layer 14. In certain embodiments, the one or more p-contact interconnects 42 comprise one or more p-contact vias. The n-contact 40, which may also be referred to as a cathode contact, may comprise one or more n-contact interconnects 44 that extend through the passivation layer 34, the barrier layer 32, the first and second reflective layers 28, 32, the p-type layer 14, and the active layer 18 to provide an electrical path to the n-type layer 16. In certain embodiments, the one or more n-contact interconnects 44 comprise one or more n-contact vias. In operation, a signal applied across the p-contact 38 and the n-contact 40 is conducted to the p-type layer 14 and the n-type layer 16, causing the LED chip 10 to emit light from the active layer 18. The p-contact 38 and the n-contact 40 can comprise many different materials such as Au, copper (Cu), nickel (Ni), In, Al, Ag, tin (Sn), Pt, or combinations thereof. In still other embodiments they can comprise conducting oxides and transparent conducting oxides such as ITO, nickel oxide (NiO), ZnO, cadmium tin oxide, indium oxide, tin oxide, magnesium oxide, $ZnGa_2O_4$, $ZnO_2/Sb$, $Ga_2O_3/Sn$, $AgInO_2/Sn$, $In_2O_3/Zn$, $CuAlO_2$, LaCuOS, $CuGaO_2$, and $SrCu_2O_2$. The choice of material used can depend on the location of the contacts and on the desired electrical characteristics, such as transparency, junction resistivity, and sheet resistance. As described above, the LED chip 10 is arranged for flip-chip mounting and the p-contact 38 and n-contact 40 are configured to be mounted or bonded to a surface, such as a printed circuit board. In this regard, the LED chip 10 includes a mounting face 46 that is configured to be mounted to a surface, and a primary light-emitting face 48 that is opposite the mounting face 46. In certain embodiments, the primary light-emitting face 48 comprises the substrate 20 and light emitted from the active layer 18 primarily exits the LED chip 10 through the substrate 20. In other embodiments, the substrate 20 may be removed or replaced.

Figure 2:
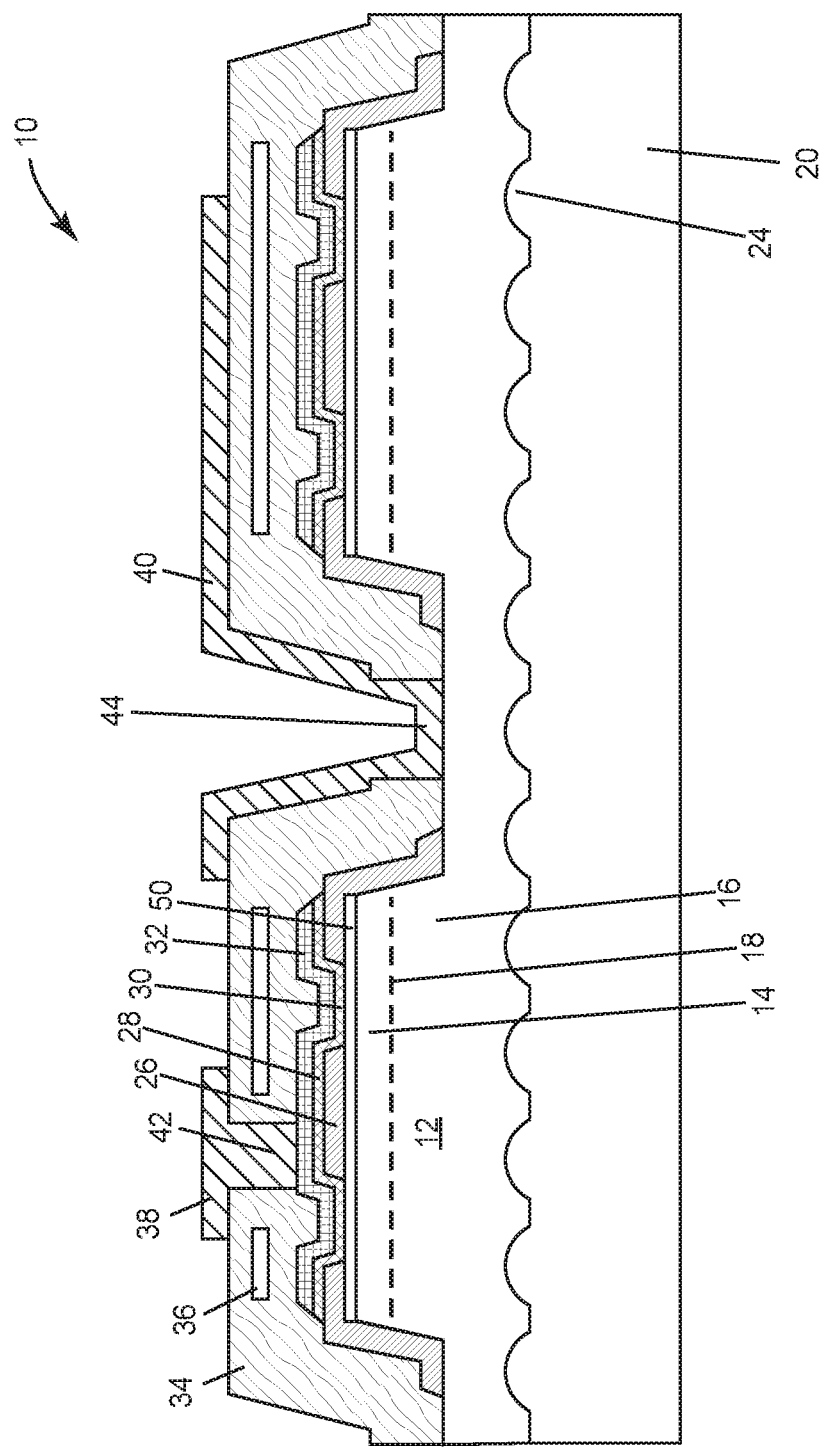
FIG. 2 is cross-sectional view of a portion of the LED chip of FIG. 1 before flip-chip mounting.

FIG. 2 is a cross-sectional view of a portion of the LED chip 10 of FIG. 1 before flip-chip mounting and includes the active LED structure 12, the p-type layer 14, the n-type layer 16, the active layer 18, the substrate 20, the patterned surface 24, the first reflective layer 26, the second reflective layer 28, the one or more reflective layer interconnects 30, the barrier layer 32, the passivation layer 34, and the interlayer 36 as previously described. A current spreading layer 50 as previously described is visible in FIG. 2. As shown, the p-contact 38, the p-contact interconnect 42, the n-contact 40, and the n-contact interconnect 44 extend through the passivation layer 34. Notably, the n-contact interconnect 44 extends through a larger opening in the passivation layer 34 than an opening in the passivation layer 34 through which the p-contact interconnect 42 extends. The n-contact interconnect 44 additionally extends through an opening in the p-type layer 14, the active region 18, and a portion of the n-type layer 16. In this regard, the n-type interconnect 44 is relatively larger than the p-type interconnect 42.

According to embodiments disclosed herein, one or more elements or combinations of elements of an LED chip, including p-contacts, n-contacts, interconnects or vias, reflective layers, and passivation layers may be arranged to form one or more indicia. In certain embodiments, the indicia may be arranged between a mounting face and a primary light-emitting face of the LED chip. In certain embodiments, at least a portion of an indicia may be arranged on a mounting face of an LED chip.

Figure 3A:
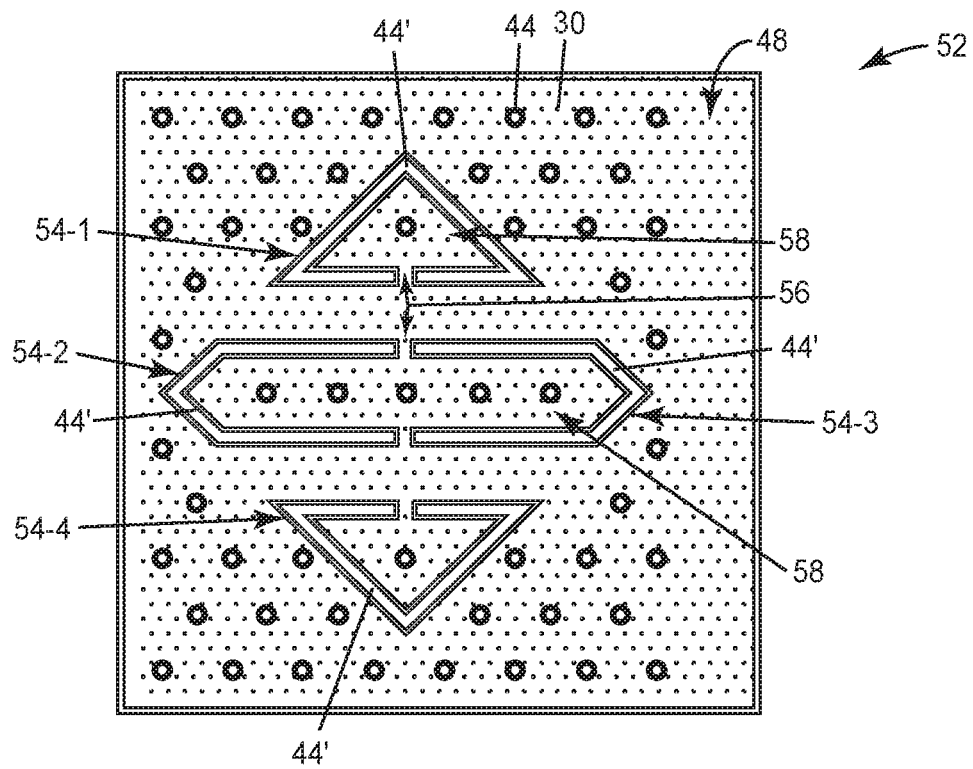
FIG. 3A is a top view of a primary light-emitting face of an LED chip where certain n-contact interconnects form an outline of an indicia according to embodiments disclosed herein.

FIG. 3A is a top view of the primary light-emitting face 48 of an LED chip 52 where certain n-contact interconnects 44' or vias form an outline of indicia 54-1 to 54-4 according to embodiments disclosed herein. The LED chip 52 includes a plurality of n-contact interconnects 44 and a plurality of reflective layer interconnects 30 as previously described. As illustrated in FIG. 3A, the n-contact interconnects 44 are larger in size and more prominent than the reflective layer interconnects 30. The n-contact interconnects 44 appear as an array of circles across the LED chip 52 and the reflective layer interconnects 30 appear as an array of smaller circles across the LED chip 52. As illustrated, the n-contact interconnects 44 create dark regions in the LED chip 52 that generally correspond to areas where the p-type layer 14 (FIG. 2) and the active layer 18 (FIG. 2) have been removed. In this regard, the n-type interconnects 44 comprise regions of the LED chip 52 that do not emit light and may additionally absorb some light from other regions of the LED chip 52. Accordingly, the n-contact interconnects 44 are typically configured to be just large enough to provide adequate electrical connections without being too large to reduce the impact on overall brightness. In order to form the indicia 54-1 to 54-4, certain n-contact interconnects 44' are configured to have a shape that corresponds to at least a portion of the indicia 54-1 to 54-4. In FIG. 3A, each of the indicia 54-1, 54-4 are formed by an n-contact interconnect 44' that comprises an elongated interconnect, via, or trench that forms the outline of a triangle shape. In a similar manner, the indicia 54-2, 54-3 are formed by n-contact interconnects 44' that form different shapes. Taken as a whole, the indicia 54-1 to 54-4 may collectively form a shape that includes a company logo as illustrated in FIG. 3A, or any of the other types of indicia as previously described. Notably, the n-contact interconnects 44' may be formed as elongated interconnects or trenches that do not connect with each other. In particular, one or more gaps 56 in the indicia 54-1 to 54-4 may be provided in order to allow areas 58 of the LED chip 52 that are bounded by the n-contact interconnects 44' to maintain electrical conductivity with other areas of the LED chip 52. In this regard, the areas 58 that are bounded by the n-contact interconnects 44' may include portions of the active LED structure (12 of FIG. 2) that are continuous with other portions of the active LED structure (12 of FIG. 2) that are not bounded by the n-contact interconnects 44'. The areas 58 may also include some of the n-contact interconnects 44 and the reflective layer interconnects 30.

Figure 3B:
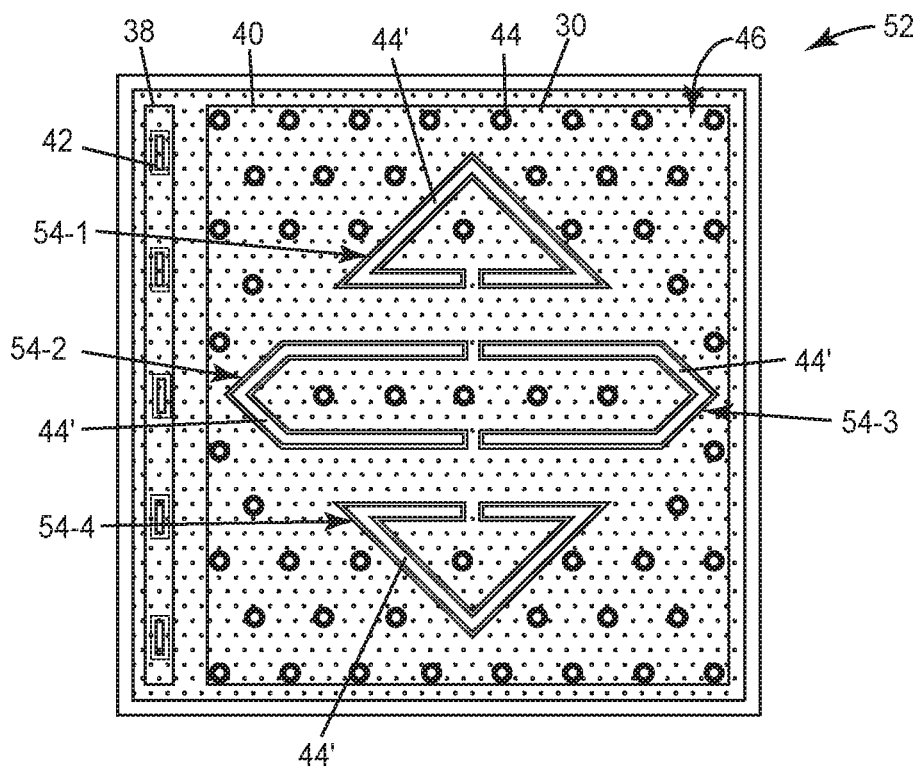
FIG. 3B is a bottom view of the mounting face of the LED chip of FIG. 3A.

FIG. 3B is a bottom view of the mounting face 46 of the LED chip 52 of FIG. 3A. As illustrated, the n-contact interconnects 44, the reflective layer interconnects 30, and the indicia 54-1 to 54-4 that are formed by the n-contact interconnects 44' are all visible from the mounting face 46. The p-contact 38 and the n-contact 40 as previously described are also visible from the mounting face 46. As illustrated, the p-contact 38 is formed in the shape of a narrow rectangle and includes several p-contact interconnects 42, and the n-contact 40 is formed in the shape of a wider rectangle on the mounting face 46. In this regard, the LED chip 52 includes the indicia 54-1 to 54-4 that are arranged between the mounting face 46 and the primary light emitting face 48 of FIG. 3A. Additionally, the indicia 54-1 to 54-4 are formed by a portion of the n-contact 40, in this case the n-contact interconnects 44 that extend into the LED chip 52 from the mounting face 46. In this manner, the indicia 54-1 to 54-4 are arranged closer to the mounting face 46 than the primary light-emitting face 48 (FIG. 3A) of the LED chip 52. The mounting face 46 of the LED chip 52 is configured to be mounted to another surface, including a reflective surface, a heat sink, another substrate, a printed circuit board, and a housing of lighting device, among others. In this regard, a method according to embodiments disclosed herein includes forming the LED chip 52 with the indicia 54-1 to 54-4 as previously described and mounting the LED chip 52 to a mounting surface such that the indicia 54-1 to 54-4 are arranged between the primary light emitting face (48 in FIG. 3A) and the mounting surface. In this manner, electrically activating the LED chip 52 may form a projection of the indicia 54-1 to 54-4 on an illuminated surface, particularly when a light focusing optic is used over the LED chip 52. Additionally, for embodiments where the indicia 54-1 to 54-4 are large enough, the indicia 54-1 to 54-4 may be visible when the LED chip 52 is electrically deactivated. Accordingly, the indicia 54-1 to 54-4 may be embedded within the LED chip 52 while still being able to convey information.

Figure 4:
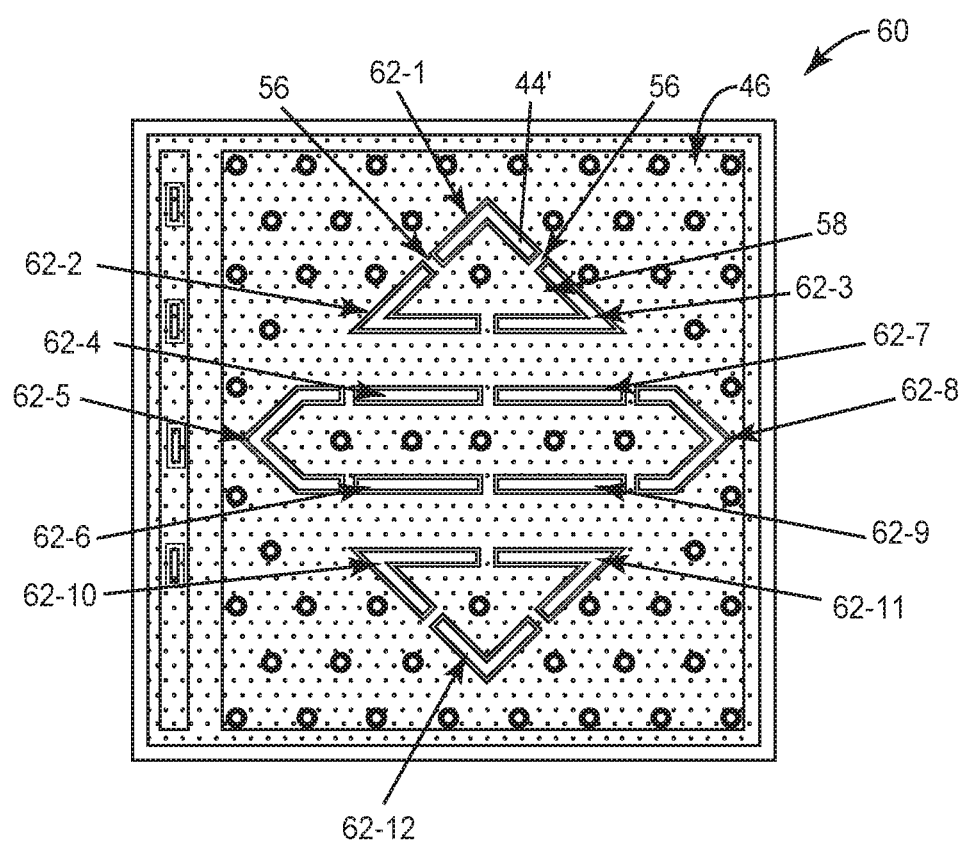
FIG. 4 is a bottom view of a mounting face of an LED chip that includes an indicia according to embodiments disclosed herein.

FIG. 4 is a bottom view of the mounting face 46 of an LED chip 60 that includes indicia 62-1 to 62-12 according to embodiments disclosed herein. The indicia 62-1 to 62-12 form an overall shape that is similar to the indicia 54-1 to 54-4 of FIGS. 3A and 3B, but with more gaps 56. In this manner, current may spread more evenly into the areas 58 that are bounded by certain n-contact interconnects 44' that from the indicia 62-1 to 62-12.

Figure 5A:
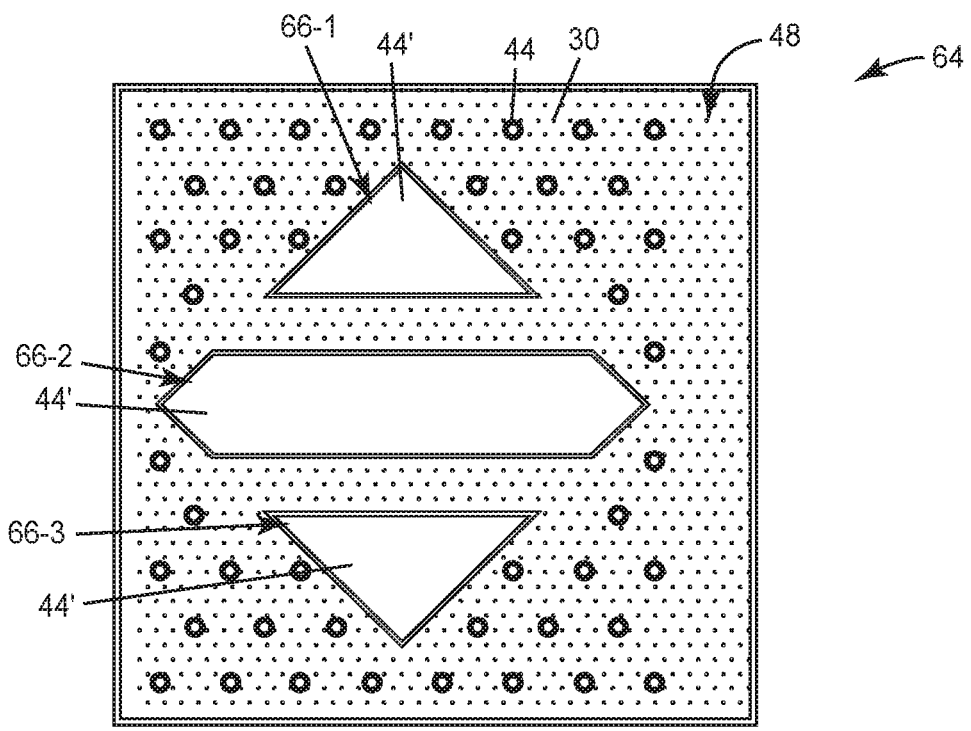
FIG. 5A is a top view of a primary light-emitting face of an LED chip where certain n-contact interconnects form an indicia according to embodiments disclosed herein.
Figure 5B:
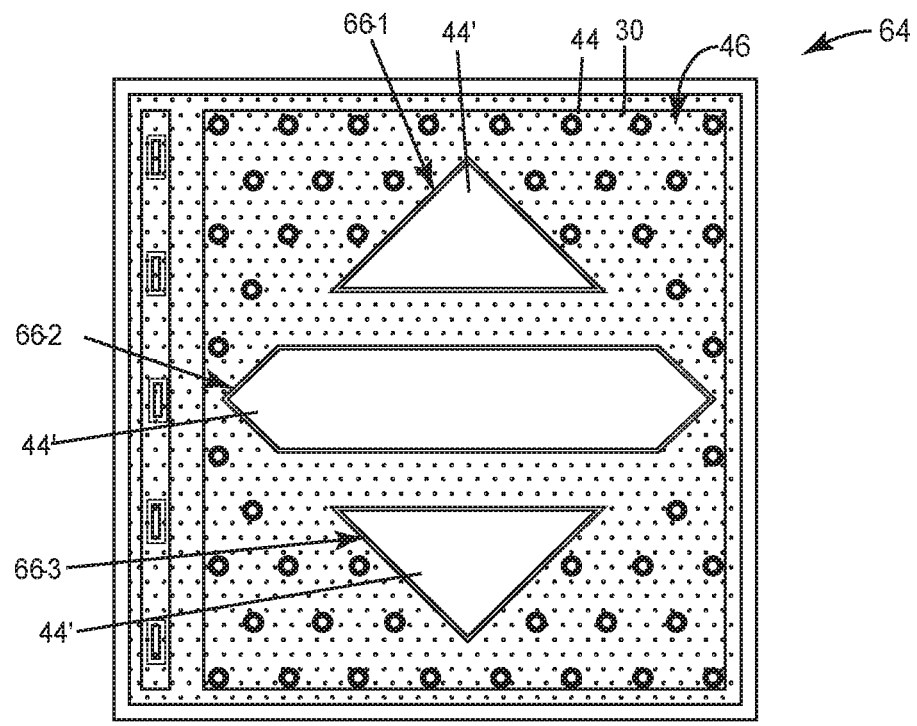
FIG. 5B is a bottom view of the mounting face of the LED chip of FIG. 3A.

FIG. 5A is a top view of the primary light-emitting face 48 of an LED chip 64 where certain n-contact interconnects 44' form indicia 66-1 to 66-3 according to embodiments disclosed herein. For the LED chip 64, a single n-contact interconnect 44' is configured to form the indicia 66-1. In a similar manner, each of the other indicia 66-2, 66-3 may also be formed by a single contact interconnect 44'. Accordingly, the shape of the indicia 66-1, in this example a triangle, comprises a single n-contact interconnect 44' that is relatively large compared with the size of the LED chip 64. The indicia 66-1 to 66-3 in FIG. 5A therefore correspond to areas that do not include the p-type layer 14 (FIG. 2), the active layer 18 (FIG. 2), the n-contact interconnects 44, or the reflective layer interconnects 30 as previously described. In this regard, the LED chip 64 may have reduced light output; however, the LED chip 64 may be beneficial for applications where a more prominent indicia is desired. For example, the indicia 66-1 to 66-3 of LED chip 64 may be large enough to be visible by some people without magnification when the LED chip 64 is electrically deactivated. Additionally, the LED chip 64 may be used in certain lighting devices that are configured to project an image of the indicia 66-1 to 66-3 on an illuminated surface, such as a handheld lighting device with a focusing optic. FIG. 5B is a bottom view of the mounting face 46 of the LED chip 64 of FIG. 5A. As with previous embodiments, the certain n-contact interconnects 44' that form the indicia 66-1 to 66-3 as well as the other n-contact interconnects 44 and the reflective layer interconnects 30 are also visible from the mounting face 46.

Figure 6:
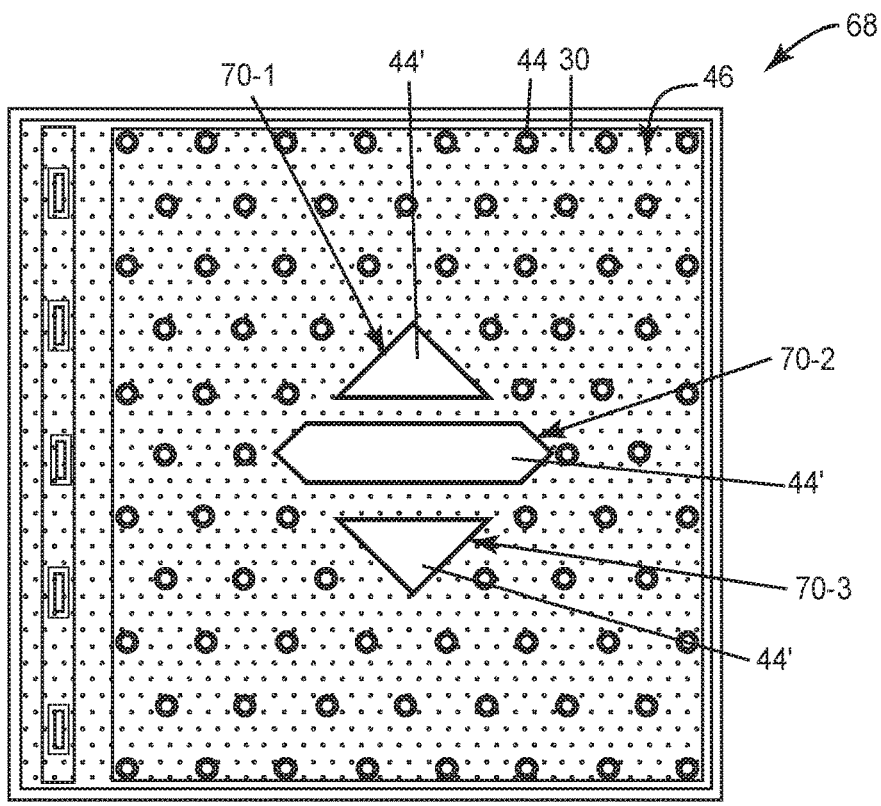
FIG. 6 is a bottom view of a mounting face of an LED chip where certain n-contact interconnects form an indicia according to embodiments disclosed herein.

FIG. 6 is a bottom view of the mounting face 46 of an LED chip 68 where certain n-contact interconnects 44' form indicia 70-1 to 70-3 according to embodiments disclosed herein. The LED chip 68 is similar to the LED chip 64 of FIGS. 5A and 5B, except the indicia 70-1 to 70-3 are smaller in size relative to the LED chip 68. In this regard, the LED chip 68 may have increased brightness in operation than the LED chip 64 of FIGS. 5A and 5B, although the indicia 70-1 to 70-3 may be less prominent.

Figure 7:
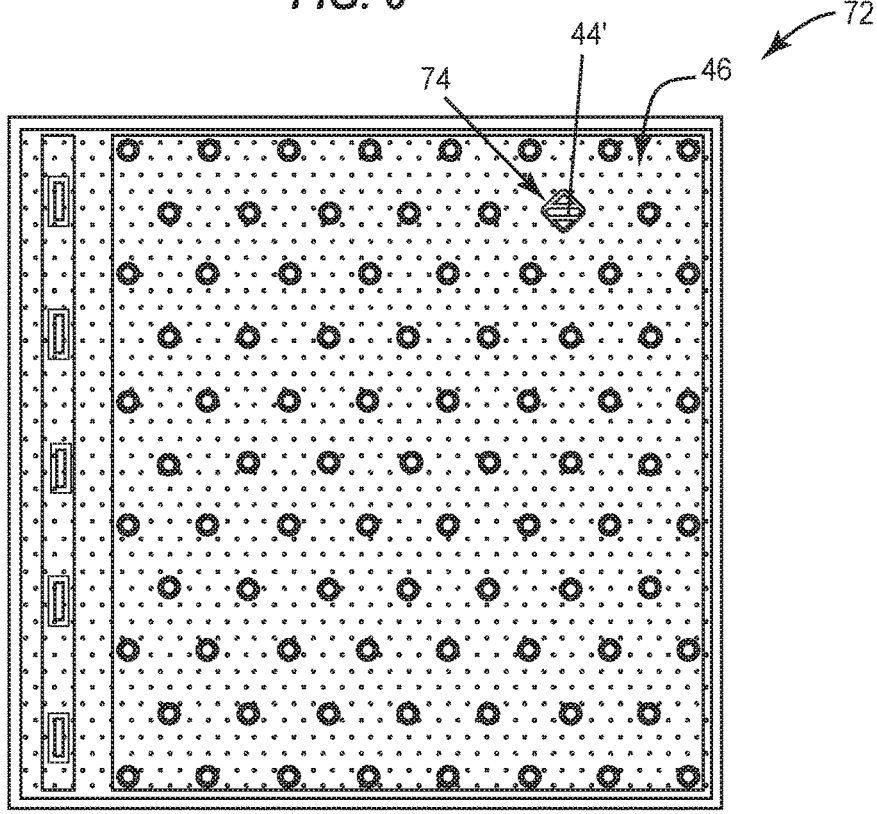
FIG. 7 is a bottom view of a mounting face of an LED chip where a single n-contact interconnect forms an indicia according to embodiments disclosed herein.

FIG. 7 is a bottom view of the mounting face 46 of an LED chip 72 where a single n-contact interconnect 44' forms an indicia 74 according to embodiments disclosed herein. The LED chip 72 is similar to the LED chip 64 of FIGS. 5A and 5B, except the indicia 74 is significantly smaller in size relative to the LED chip 72. In this regard, the LED chip 72 may have even more increased brightness in operation than the LED chip 64 of FIGS. 5A and 5B and the LED chip 68 of FIG. 6, although the indicia 74 may be significantly less prominent. In this regard, the indicia 74 may only be visible under microscopic magnification.

Figure 8A:
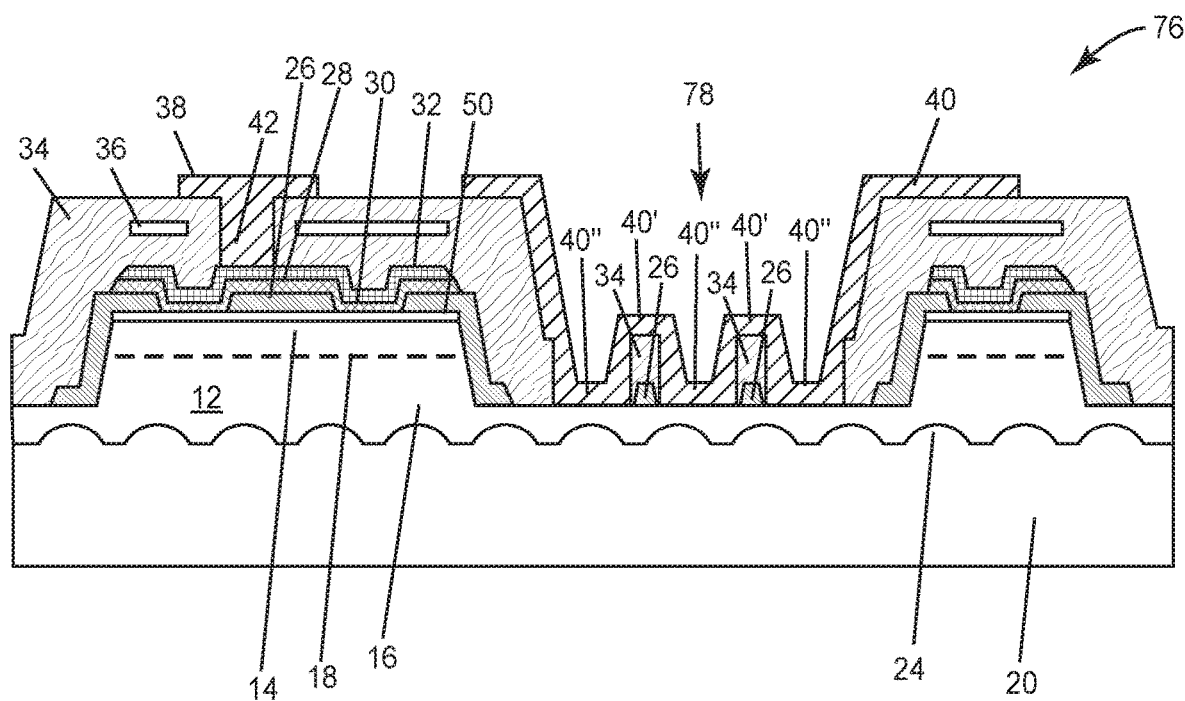
FIG. 8A is cross-sectional view of a portion of an LED chip.
Figure 8B:
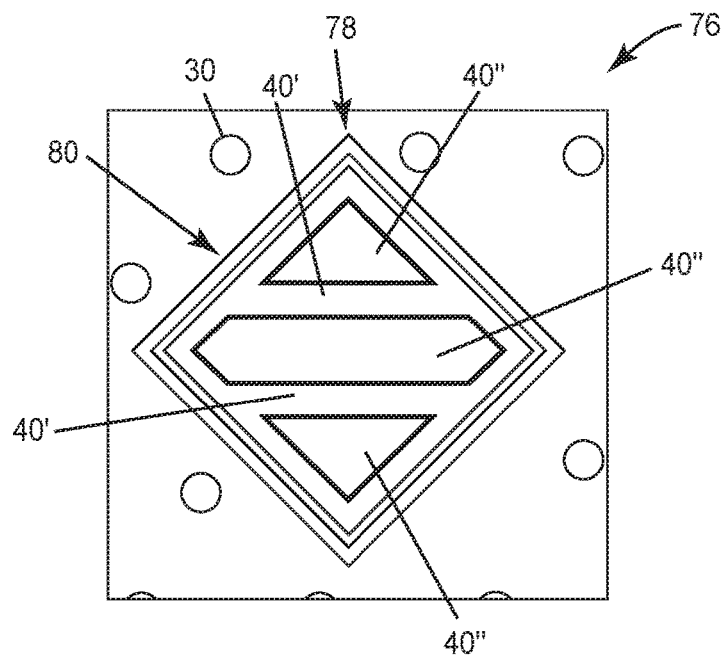
FIG. 8B represents a magnified top view of a portion of the LED chip of FIG. 8A.

FIG. 8A is cross-sectional view of a portion of an LED chip 76 before flip-chip mounting that may include the active LED structure 12, the p-type layer 14, the n-type layer 16, the active layer 18, the substrate 20, the patterned surface 24, the first reflective layer 26, the second reflective layer 28, the one or more reflective layer interconnects 30, the barrier layer 32, the passivation layer 34, the interlayer 36, the p-contact 38, the p-contact interconnect 42, and the n-contact 40, as previously described. In FIG. 8A, an n-contact interconnect 78 is similar to previous embodiments, but also includes additional features that may contribute to the shape of an indicia. For example, one or more portions of the first reflective layer 26 and the passivation layer 34 may be included on the n-type layer 16 before the n-contact 40 is formed. In this manner, the n-contact 40 may include one or more first portions 40' that are spaced farther away from the n-type layer 16 than one or more second portions 40" within the n-contact interconnect 78. FIG. 8B represents a magnified top view of a portion of the LED chip 76 of FIG. 8A that includes the n-contact interconnect 78 and several reflective layer interconnects 30. As illustrated, the one or more first portions 40' and the one or more second portions 40" may form respective portions of an indicia 80. In this regard, the indicia 80 may be formed by a single n-contact interconnect 78, in a similar manner as the indicia 74 of FIG. 7.

Figure 9A:
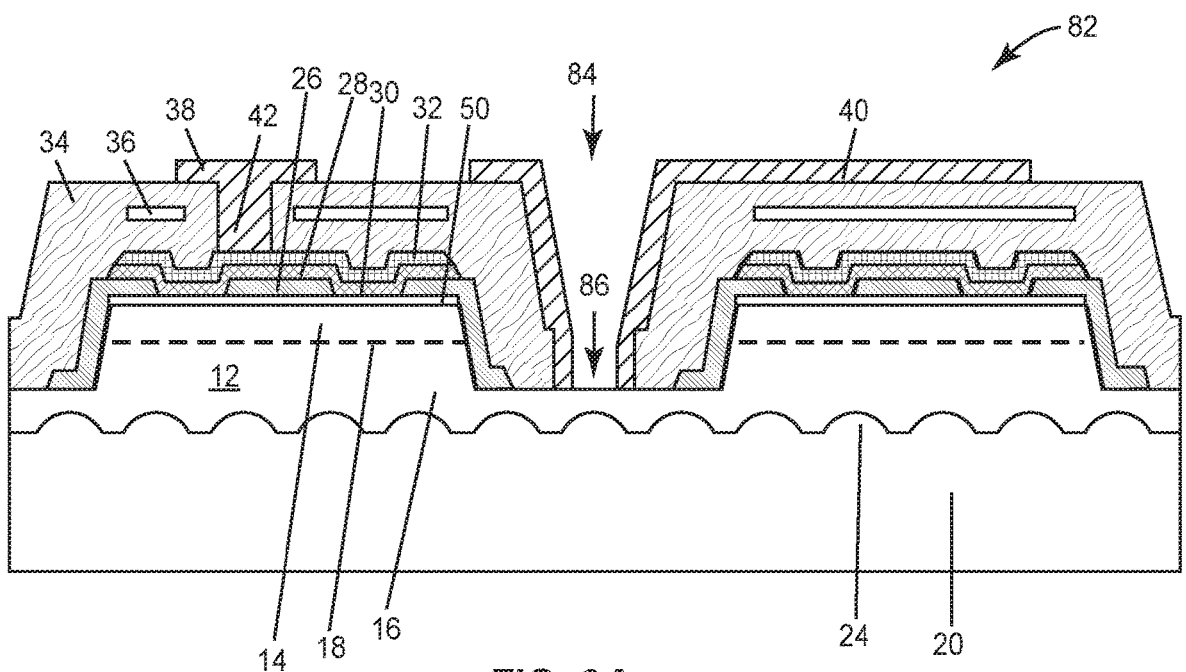
FIG. 9A is cross-sectional view of a portion of an LED.
Figure 9B:
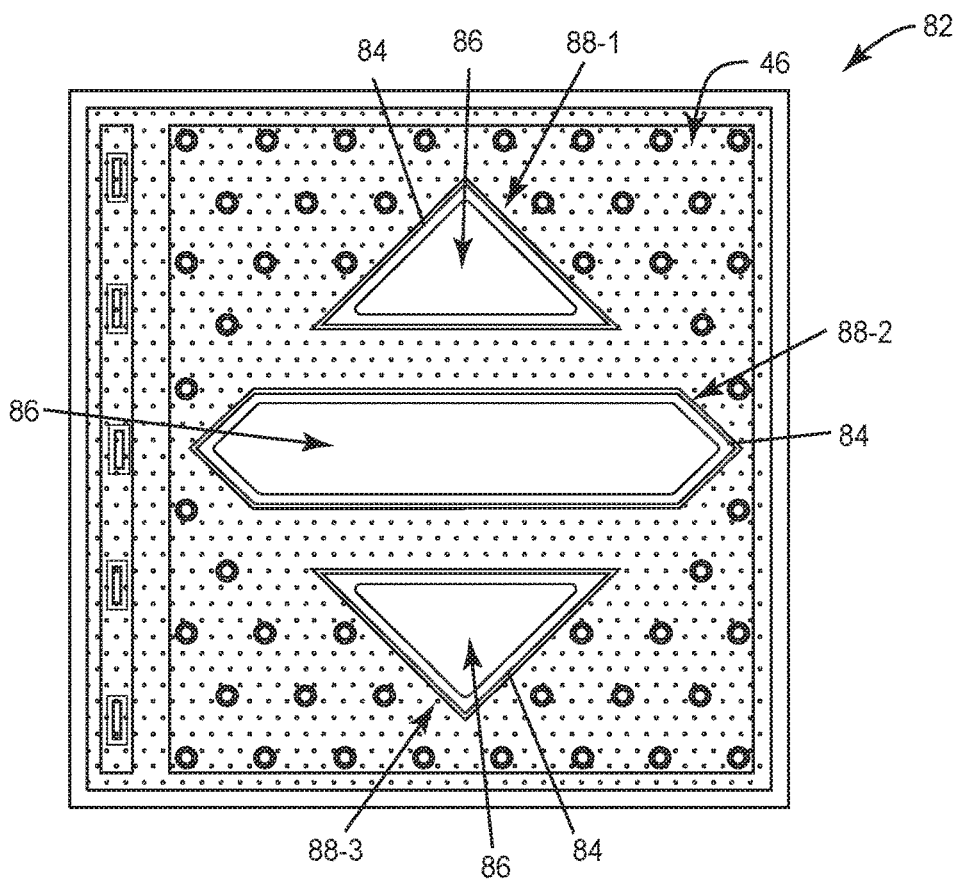
FIG. 9B is a bottom view of the mounting face of the LED chip of FIG. 8A.

FIG. 9A is cross-sectional view of a portion of an LED chip 82 before flip-chip mounting that may include the active LED structure 12, p-type layer 14, the n-type layer 16, the active layer 18, the substrate 20, the patterned surface 24, the first reflective layer 26, the second reflective layer 28, the one or more reflective layer interconnects 30, the barrier layer 32, the passivation layer 34, the interlayer 36, the p-contact 38, the p-contact interconnect 42, and the n-contact 40, as previously described. In FIG. 8A, an n-contact interconnect 84 is similar to previous embodiments, but the n-contact 40 is discontinuous within the n-contact interconnect 84. In this regard, the n-contact 40 extends through an opening in the passivation layer 34, the p-type layer 14, and the active layer 18 to provide an electrical connection with the n-type layer 16. While providing electrical connection, the n-contact 40 includes one or more openings 86 such that the n-contact 40 is discontinuous within the n-contact interconnect 84. FIG. 9B is a bottom view of the mounting face 46 of the LED chip 82 of FIG. 8A. As shown, multiple n-contact interconnects 84 are configured to form indicia 88-1 to 88-3 similar to previous embodiments; however, the outline of the indicia 88-1 to 88-3 forms a double-line appearance due to the openings 86.

Figure 10A:
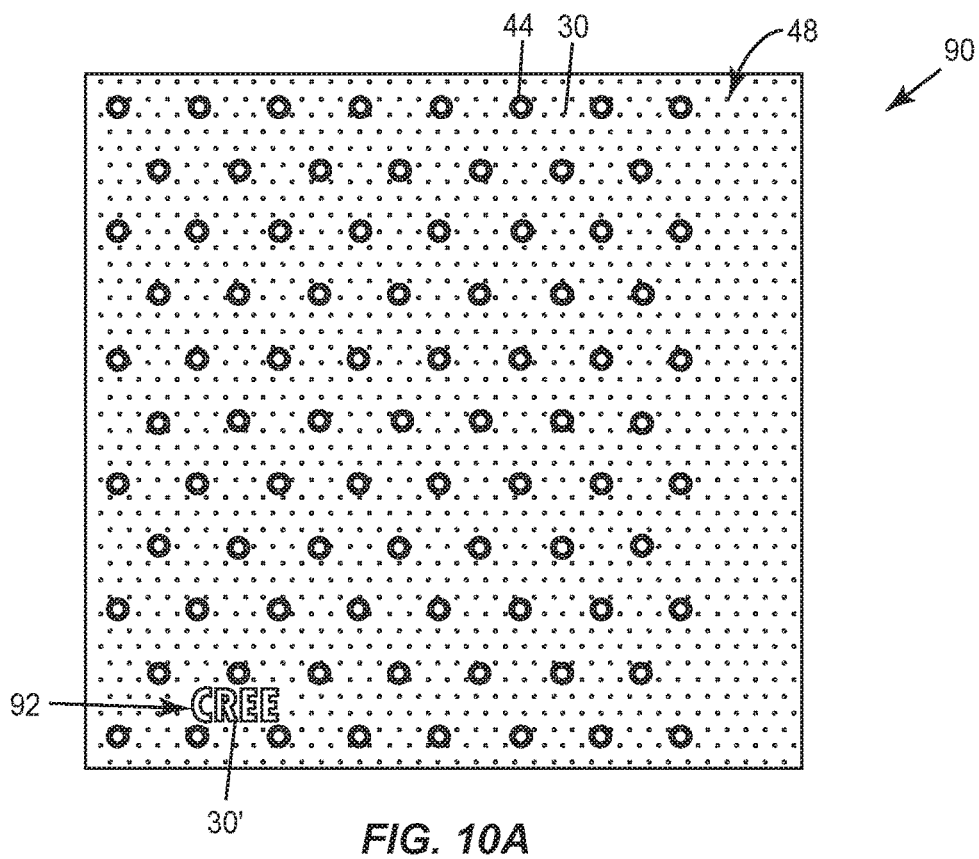
FIG. 10A is a top view of a primary light-emitting face of an LED chip where one or more certain reflective layer interconnects form an outline of an indicia according to embodiments disclosed herein.
Figure 10B:
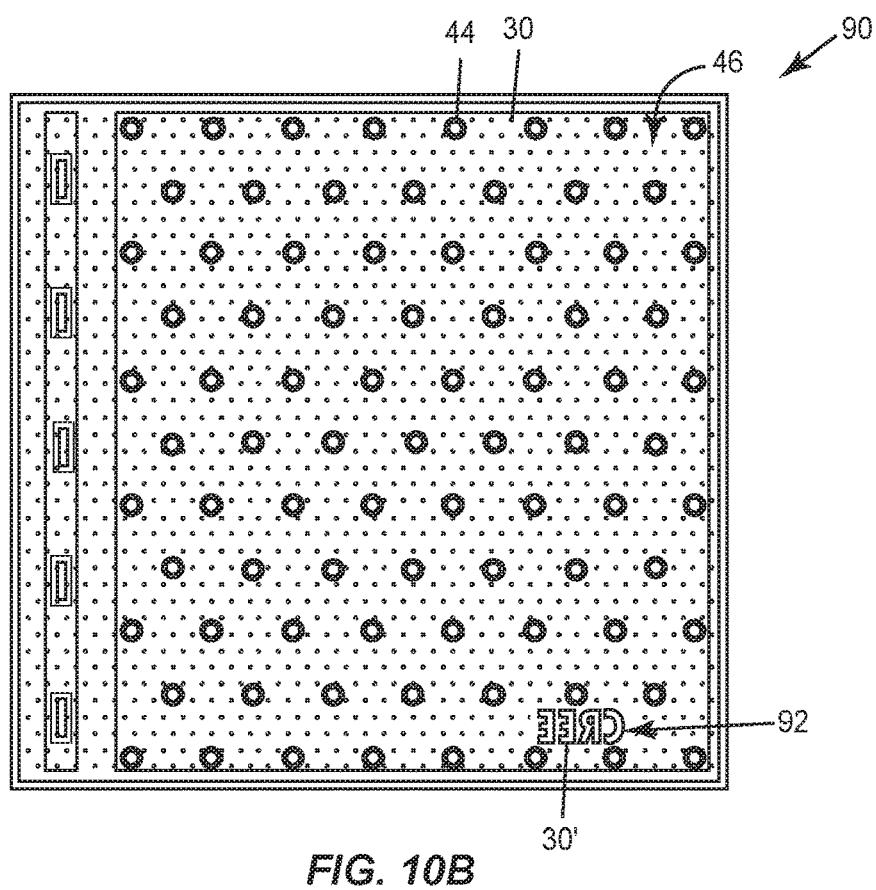
FIG. 10B is a bottom view of the mounting face of the LED chip of FIG. 10A.

FIG. 10A is a top view of the primary light-emitting face 48 of an LED chip 90 where one or more certain reflective layer interconnects 30' or reflective layer vias form an outline of an indicia 92 according to embodiments disclosed herein. The LED chip 90 includes a plurality of n-contact interconnects 44 and a plurality of reflective layer interconnects 30 as previously described. In FIG. 10A, the one or more certain reflective layer interconnects 30' or vias comprise one or more shapes to form an indicia 92. By way of non-limiting example, the one or more certain reflective layer interconnects 30' are formed to provide the indicia 92 that comprises the text "CREE." In this regard, the indicia 92 may convey information pertaining the manufacturer of the LED chip 90. In certain embodiments, a single continuous reflective layer interconnect 30' may be used to form each individual letter or number of alphanumeric characters. In certain embodiments, a single continuous reflective layer interconnect 30' or multiple reflective layer interconnects 30' may be used to form an indicia having a different shape, including at least one of a logo, one or more different alphanumeric characters, or a symbol, among others that are configured to convey other or additional information. As previously described, the reflective layer interconnects 30, 30' may be smaller and less prominent than the n-contact interconnects 44, and accordingly, the indicia 92 formed with one or more reflective layer interconnects 30' may require microscopic magnification to be viewable. FIG. 10B is a bottom view of the mounting face 46 of the LED chip 90 of FIG. 10A. As illustrated, the n-contact interconnects 44, the reflective layer interconnects 30, and the indicia 92 are all visible from the mounting face 46. In further embodiments, where the LED chip 90 includes one or more additional elements, such as lumiphoric materials, or the LED chip 90 has been mounted to another surface, the indicia 92 may not be viewable without destructive teardown of the LED chip 90 or a lighting device in which the LED chip 90 is mounted. In this regard, the indicia 92 may not have significant impact on the brightness or other performance characteristics of the LED chip 90 and may be hidden from an end user.

Figure 11A:
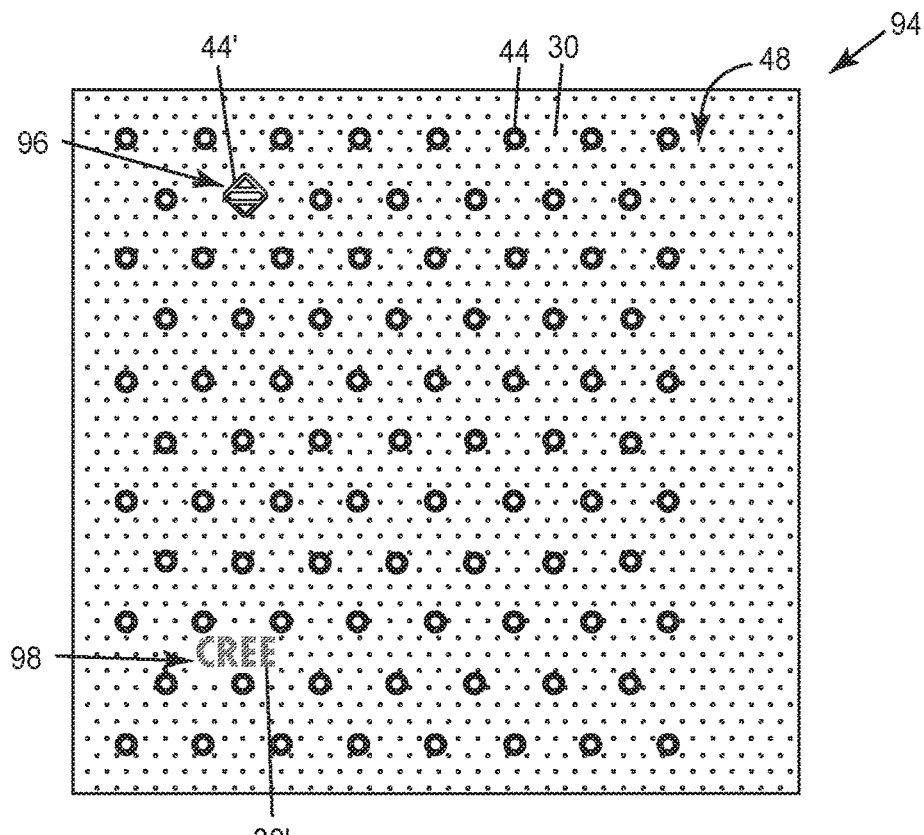
FIG. 11A is a top view of the primary light-emitting face of an LED chip where one or more certain n-contact interconnects form an indicia and one or more certain reflective layer interconnects form another indicia according to embodiments disclosed herein.
Figure 11B:
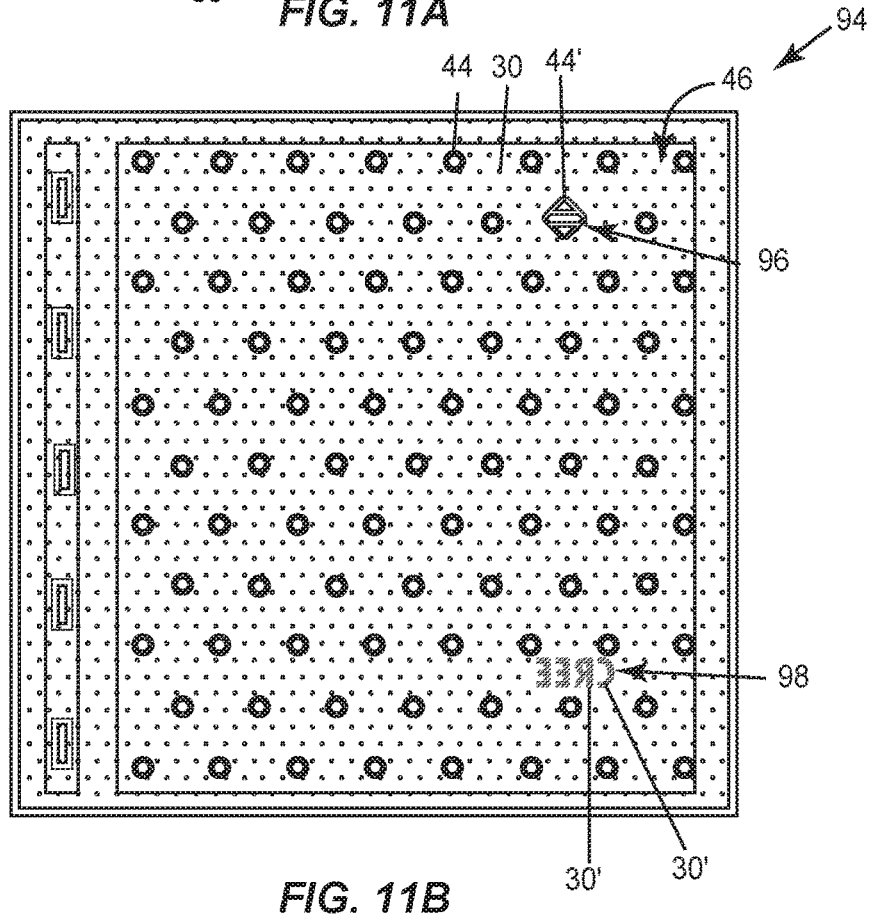
FIG. 11B is a bottom view of the mounting face of the LED chip of FIG. 11A.

FIG. 11A is a top view of the primary light-emitting face 48 of an LED chip 94 where one or more certain n-contact interconnects 44' form an indicia 96 and one or more certain reflective layer interconnects 30' form another indicia 98 according to embodiments disclosed herein. In certain embodiments, the indicia 96 and the other indicia 98 include different ones of a logo, one or more alphanumeric characters, or a symbol, among others that are configured to convey other or additional information. By way of a non-limiting example, the indicia 96 comprises the shape of a logo while the indicia 98 comprises alphanumeric characters. As previously described the n-contact interconnects 44, 44' are part of the n-contact (40 in FIG. 1) that is electrically connected to the n-type layer (16 in FIG. 1) and the reflective layer interconnects 30, 30' are part of the reflector layer or a reflective layer structure that includes the first reflective layer (26 in FIG. 1) and the second reflective layer (28 in FIG. 1). In this regard, the LED chip 94 includes the n-contact that is electrically connected to the n-type layer and at least a portion of the n-contact forms the indicia 96. In a similar manner, the LED chip 94 also includes the reflector layer on the p-type layer (14 in FIG. 1) wherein a portion of the reflector layer forms another indicia 98. FIG. 11B is a bottom view of the mounting face 46 of the LED chip 94 of FIG. 11A. As illustrated, the n-contact interconnects 44, 44' and the reflective layer interconnects 30, 30' as well as the indicia 96, 98 are all visible from the mounting face 46. Notably, in certain embodiments, multiple ones of the reflective layer interconnects 30' may be arranged to form a single alphanumeric character or a symbol. By way of non-limiting example, multiple reflective layer interconnects 30' are spaced closely together to from the backwards "C" of the text "CREE" of the indicia 98. In certain embodiments, the reflective layer interconnects 30' may be smaller in size than the other reflective layer interconnects 30. In other embodiments all of the reflective layer interconnects 30, 30' may comprise a same size.

Figure 12A:
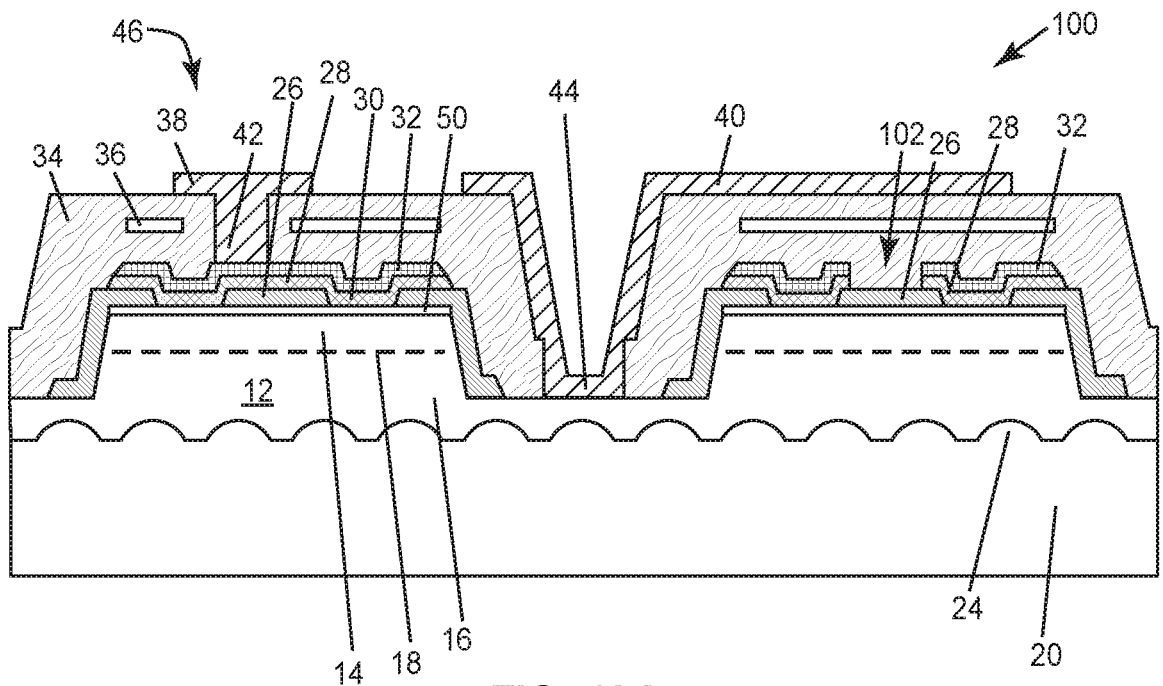
FIG. 12A is cross-sectional view of a portion of an LED chip.
Figure 12B:
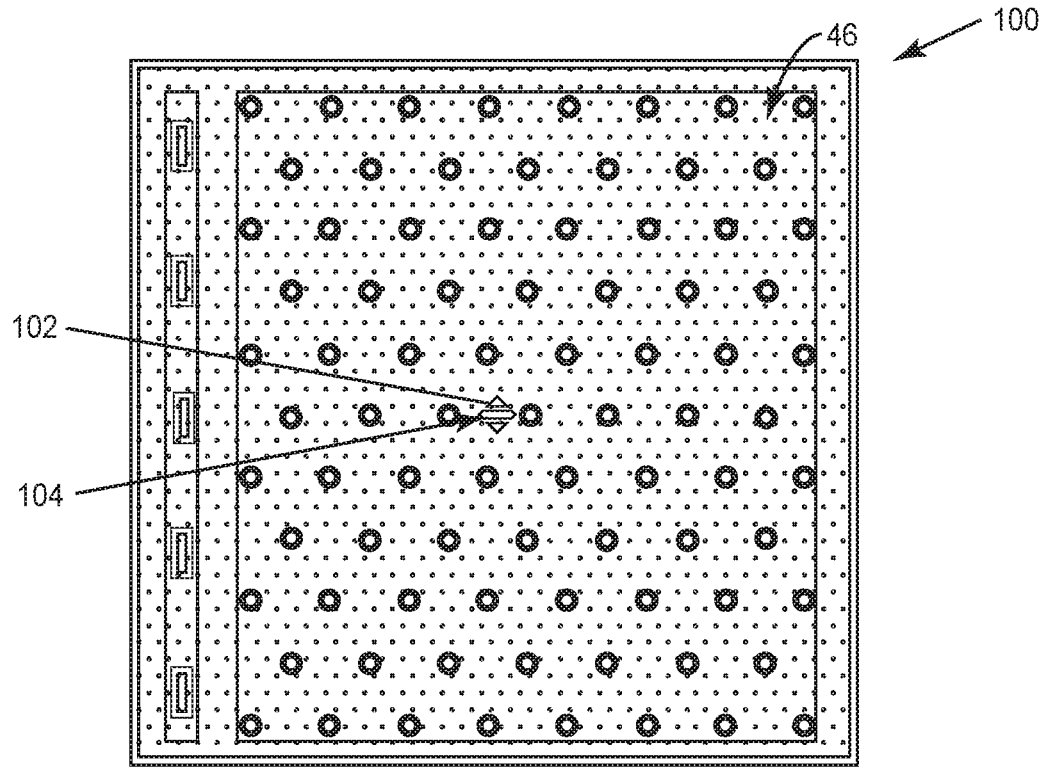
FIG. 12B is a bottom view of the mounting face of the LED chip of FIG. 10A.
Figure 12C:
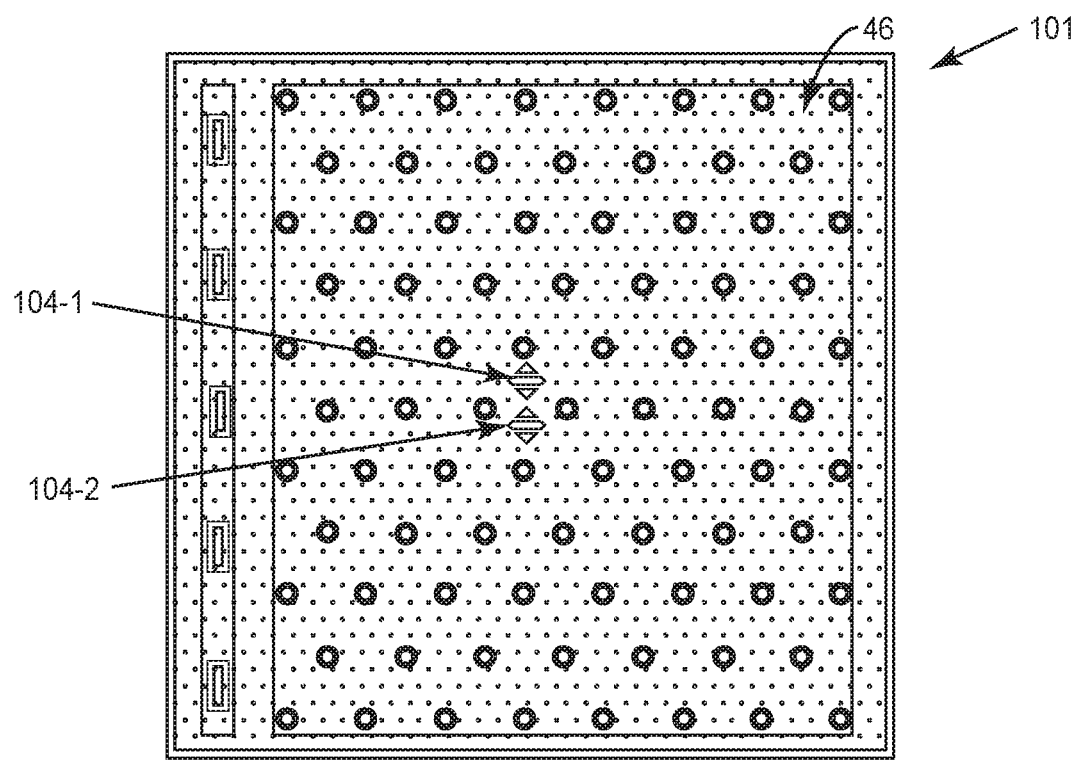
FIG. 12C is a bottom view of the mounting face of an LED chip according to embodiments disclosed herein.

FIG. 12A is cross-sectional view of a portion of an LED chip 100 before flip-chip mounting that may include the active LED structure 12, the p-type layer 14, the n-type layer 16, the active layer 18, the substrate 20, the patterned surface 24, the first reflective layer 26, the second reflective layer 28, the one or more reflective layer interconnects 30, the barrier layer 32, the passivation layer 34, the interlayer 36, the p-contact 38, the p-contact interconnect 42, the n-contact 40, and the n-contact interconnect 44 as previously described. The first reflective layer 26, the second reflective layer 28, and the one or more reflective layer interconnects 30 may collectively form a reflective structure for the LED chip 100. In FIG. 12A, the second reflective layer 28 may include one or more openings 102 that may also extend though the barrier layer 32. In further embodiments, the one or more openings 102 may also extend through the first reflective layer 26. FIG. 12B is a bottom view of the mounting face 46 of the LED chip 100 of FIG. 12A. In certain embodiments, the one or more openings 102 may form a pattern of at least a portion of the reflective structure that forms an indicia 104 as previously described. FIG. 12C is a bottom view of the mounting face 46 of an LED chip 101 that is similar to the LED chip 100 of FIG. 12B. In FIG. 12C, the LED chip 101 includes indicia 104-1, 104-2 that are arranged to form at least one of an alignment marker, a fiducial marker, or a polarity marker. During subsequent processing steps, the indicia 104-1, 104-2 can be optically imaged or otherwise viewed to provide information on how to align or position the LED chip 101 for such applications as electrical testing, or precise alignment of the LED chip 101 for die attach. In FIG. 12C, the indicia 104-1, 104-2 are illustrated as vertically aligned at or near a center of the LED chip 101; however, the indicia 104-1, 104-2 can be configured in many different arrangements depending on the type of information the indicia 104-1, 104-2 are intended to convey. Additionally, the indicia 104-1, 104-2 that are arranged to form at least one of an alignment marker, a fiducial marker, or a polarity marker may be formed according to any of the embodiments disclosed herein, including embodiments where the indicia 104-1, 104-2 are formed by at least one of a portion of an n-contact, one or more n-contact interconnects, a portion of a reflective structure, one or more reflective layer interconnects, or a portion of a p-contact of the LED 101.

Figure 13A:
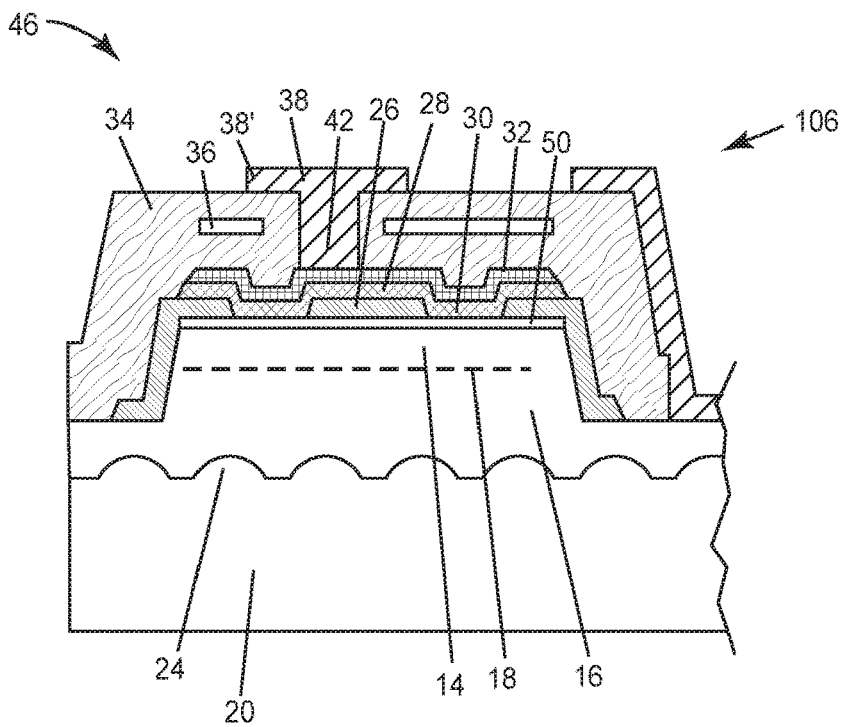
FIG. 13A is partial cross-sectional view of an LED chip.
Figure 13B:
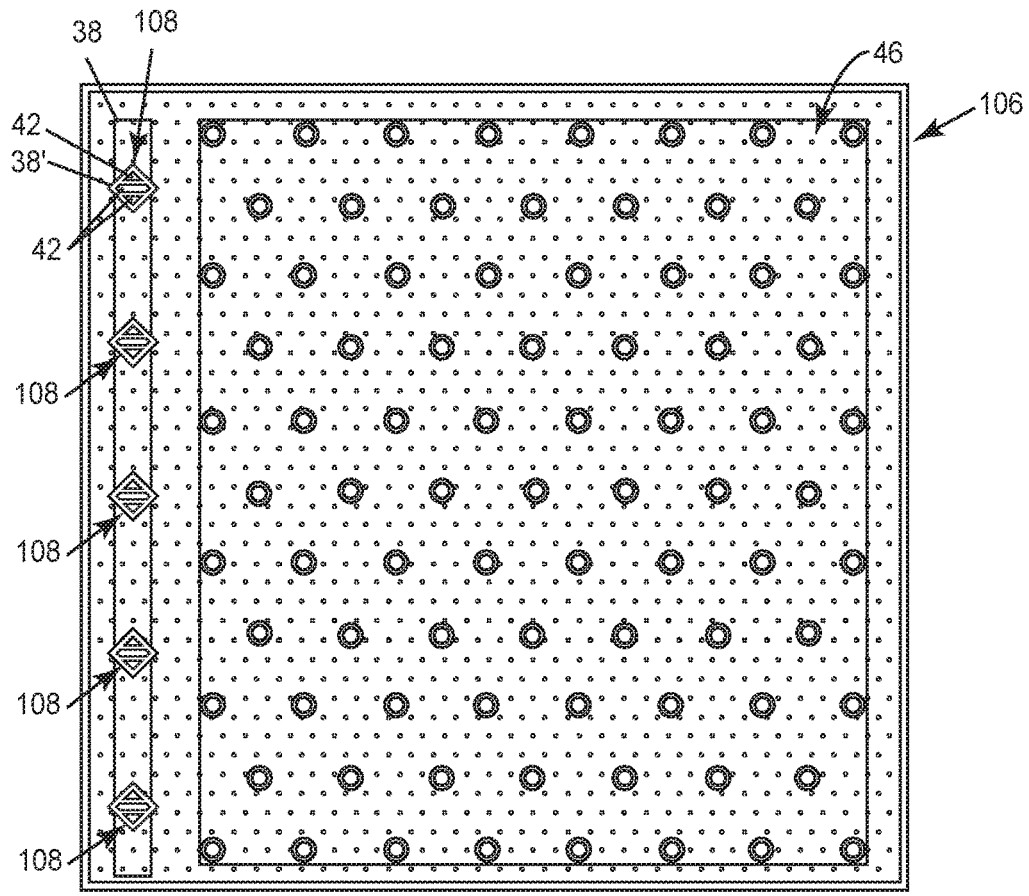
FIG. 13B is a bottom view of the mounting face of the LED chip of FIG. 13A.

FIG. 13A is partial cross-sectional view of an LED chip 106 before flip-chip mounting according to embodiments disclosed herein. In FIG. 13A, a zoomed in view is shown to illustrate the p-type layer 14, the n-type layer 16, the active layer 18, the substrate 20, the patterned surface 24, the first reflective layer 26, the second reflective layer 28, the one or more reflective layer interconnects 30, the barrier layer 32, the passivation layer 34, the interlayer 36, the p-contact 38, and the p-contact interconnect 42 as previously described. Notably, the p-contact 38 includes a portion 38' that is on the passivation layer 34 as well as the p-contact interconnect 42 that extends through the passivation layer 34 to provide an electrical connection with the p-type layer 14. In this regard, at least a portion of the p-contact 38 is on the mounting face 46. In certain embodiments and as further illustrated in FIG. 13B, the p-contact 38 may form an indicia as previously described. FIG. 13B is a bottom view of the mounting face 46 of the LED chip 106 of FIG. 13A. As illustrated in FIG. 13B, the shape of one or more p-contact interconnects 42 are configured to form an indicia 108 or at least a portion of the indicia 108 in certain embodiments. Additionally, the portion 38' of the p-contact 38 that is on the passivation layer (34 of FIG. 13A) may be configured to form at least another portion of the indicia 108. In certain embodiments, the p-contact 38 may form multiple indicia 108 that may be configured the same as illustrated in FIG. 13B or different in other embodiments.

Those skilled in the art will recognize improvements and modifications to the preferred embodiments of the present disclosure. All such improvements and modifications are considered within the scope of the concepts disclosed herein and the claims that follow.

What is claimed is:

1. A light emitting diode (LED) chip, comprising:
   a mounting face configured to be mounted to a surface;
   a primary light-emitting face that is opposite the mounting face;
   an active LED structure arranged between the mounting face and the primary light-emitting face, wherein the active LED structure comprises an n-type layer, a p-type layer, and an active layer arranged between the n-type layer and the p-type layer; and
   an indicia arranged between the mounting face and the primary light-emitting face, wherein the indicia extends through an opening in the p-type layer and the active layer and a continuous portion of the opening is elongated across the primary light-emitting face to form an outline of the indicia, and wherein a portion of the p-type layer and the active layer are bounded within the outline of the indicia.

2. The LED chip of claim 1, wherein the indicia comprises at least one of a logo, one or more alphanumeric characters, a symbol, an alignment marker, a fiducial marker, or a polarity marker configured to convey information.

3. The LED chip of claim 1, wherein the indicia is arranged closer to the mounting face than the primary light-emitting face.

4. The LED chip of claim 1, further comprising an n-contact electrically connected to the n-type layer, wherein a portion of the n-contact forms the indicia.

5. The LED chip of claim 4, wherein the n-contact comprises one or more n-contact interconnects that extend through a portion of the active LED structure to the n-type layer.

6. The LED chip of claim 5, wherein the one or more n-contact interconnects form the indicia.

7. The LED chip of claim 5, wherein the one or more n-contact interconnects form the outline of the indicia.

8. The LED chip of claim 7, wherein the portion of the active LED structure that is bounded by the outline is continuous with other portions of the active LED structure that are not bounded by the outline.

9. The LED chip of claim 1, further comprising a reflective structure on the p-type layer, wherein a portion of the reflective structure forms the indicia.

10. The LED chip of claim 9, wherein the reflective structure comprises a metal layer, a dielectric layer, and one or more reflective layer interconnects that extend through a portion of the dielectric layer.

11. The LED chip of claim 10, wherein the one or more reflective layer interconnects form the indicia.

12. The LED chip of claim 9, wherein a pattern of the reflective structure forms the indicia.

13. The LED chip of claim 1 further comprising:
    an n-contact electrically connected to the n-type layer, wherein a portion of the n-contact forms the indicia; and
    a reflector layer on the p-type layer wherein a portion of the reflector layer forms another indicia.

14. The LED chip of claim 1, further comprising a growth substrate, wherein a portion of the growth substrate forms the primary light-emitting face.

15. A light emitting diode (LED) chip, comprising:
    a mounting face configured to be mounted to a surface;
    a primary light-emitting face that is opposite the mounting face;
    an active LED structure arranged between the mounting face and the primary light-emitting face, wherein the active LED structure comprises an n-type layer, a p-type layer, and an active layer arranged between the n-type layer and the p-type layer;
    a passivation layer on the p-type layer; and
    a p-contact electrically connected to the p-type layer, wherein the p-contact comprises a portion that is on the mounting face and a plurality of p-contact interconnects that extend through the passivation layer, wherein individual ones of the plurality of the p-contact interconnects extend through the passivation layer with different shapes from one another and the plurality of p-contact interconnects are grouped together to form at least a portion of an indicia arranged on the mounting face.

16. The LED chip of claim 15, wherein the p-contact and the plurality of the p-contact interconnects form the indicia.

17. The LED chip of claim 15, wherein the portion of the p-contact that is on the mounting face forms another portion of the indicia.

18. The LED chip of claim 15, wherein the indicia comprises at least one of a logo, one or more alphanumeric characters, a symbol, an alignment marker, a fiducial marker, or a polarity marker configured to convey information.

* * * * *